US007070406B2

(12) United States Patent
Jeans

(10) Patent No.: US 7,070,406 B2
(45) Date of Patent: Jul. 4, 2006

(54) APPARATUS FOR EMBOSSING A FLEXIBLE SUBSTRATE WITH A PATTERN CARRIED BY AN OPTICALLY TRANSPARENT COMPLIANT MEDIA

(75) Inventor: Albert H. Jeans, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 359 days.

(21) Appl. No.: 10/425,798

(22) Filed: Apr. 29, 2003

(65) Prior Publication Data

US 2004/0219246 A1 Nov. 4, 2004

(51) Int. Cl.
*B29B 13/00* (2006.01)

(52) U.S. Cl. .................. 425/174.4; 425/115; 425/327; 425/363; 425/194; 425/409; 264/496

(58) Field of Classification Search ............... 425/174, 425/115, 327, 363, 194, 409; 264/496
See application file for complete search history.

(56) References Cited

U.S. PATENT DOCUMENTS

| 2,516,254 | A | * | 7/1950 | Plauka et al. ............... 427/277 |
| 2,849,752 | A | * | 9/1958 | Leary ........................... 425/11 |
| 3,246,365 | A | * | 4/1966 | Kloender ................... 425/367 |
| 3,345,234 | A | * | 10/1967 | Jecker et al. ............... 156/209 |
| 4,038,917 | A | * | 8/1977 | DeLigt ........................ 101/23 |
| 4,138,945 | A | * | 2/1979 | Rejto .......................... 101/470 |
| 4,248,652 | A | * | 2/1981 | Civardi et al. .............. 156/219 |
| 4,341,581 | A | * | 7/1982 | Civardi et al. .............. 156/209 |
| 4,769,202 | A | * | 9/1988 | Eroskey et al. ............. 264/166 |
| 4,943,351 | A | * | 7/1990 | Wedel ......................... 162/205 |
| 5,049,918 | A | * | 9/1991 | Hisada et al. ............... 355/403 |
| 5,103,256 | A | * | 4/1992 | Tanabe ........................ 355/32 |
| 5,118,532 | A | * | 6/1992 | Batson et al. ............... 427/278 |
| 5,230,776 | A | * | 7/1993 | Andersson et al. ......... 162/290 |
| 5,283,017 | A | * | 2/1994 | Rohleder et al. ........... 264/448 |
| 5,429,696 | A | * | 7/1995 | Rohleder et al. ........... 156/220 |
| 5,460,757 | A | * | 10/1995 | Hedgecoth ................... 264/400 |
| 5,780,140 | A | * | 7/1998 | Nilsen ......................... 428/172 |
| 5,985,084 | A |   | 11/1999 | Summersgill et al. |
| 6,024,907 | A | * | 2/2000 | Jagunich ...................... 264/284 |
| 6,200,399 | B1 | * | 3/2001 | Thielman .................... 156/73.1 |
| 6,206,672 | B1 | * | 3/2001 | Grenda ...................... 425/174.4 |
| 6,284,072 | B1 |   | 9/2001 | Ryan et al. |
| 6,348,999 | B1 |   | 2/2002 | Summersgill et al. |
| 6,456,816 | B1 | * | 9/2002 | Chowdry et al. ........... 399/302 |
| 6,495,214 | B1 | * | 12/2002 | Prix et al. .................... 427/510 |
| 6,517,995 | B1 |   | 2/2003 | Jacobson et al. |

(Continued)

OTHER PUBLICATIONS

Nanoimprint Lithograhpy in Topas, a highly UV-transparent and chemically resistant thermoplast' Theodor Nielsen, et al; Mikroelekronik Centret (MIC), Techincal University of Demark 9DTU).

(Continued)

*Primary Examiner*—Robert Davis
*Assistant Examiner*—G. Nagesh Rao

(57) ABSTRACT

An apparatus for embossing a flexible substrate with an optically transparent compliant media is disclosed. The complaint media includes an optically transparent imprint stamp with an imprint pattern therein. The flexible substrate is coated with a photopolymer material. The compliant media can be connected with an optically transparent belt material to form an embossing belt or connected with an optically transparent cylinder to from an embossing drum. A coated side of the flexible substrate is urged into contact with the imprint stamp and the imprint pattern is embossed in the photopolymer material and an ultraviolet light passing through the compliant media contemporaneously cures the photopolymer material during the embossing.

16 Claims, 23 Drawing Sheets

U.S. PATENT DOCUMENTS

| | | | |
|---|---|---|---|
| 6,659,759 B1* | 12/2003 | Anzai et al. | 425/515 |
| 6,866,737 B1* | 3/2005 | Wright et al. | 156/209 |
| 6,908,295 B1* | 6/2005 | Thielman et al. | 425/371 |
| 2001/0009172 A1* | 7/2001 | Thielman et al. | 156/73.1 |
| 2003/0006535 A1* | 1/2003 | Hennessey et al. | 264/403 |
| 2003/0056885 A1* | 3/2003 | Wright et al. | 156/209 |
| 2003/0098134 A1* | 5/2003 | Scherb et al. | 162/117 |
| 2003/0102591 A1* | 6/2003 | Thielman et al. | 264/166 |
| 2005/0051260 A1* | 3/2005 | Wright et al. | 156/209 |
| 2005/0160893 A1* | 7/2005 | Hennessey et al. | 83/346 |
| 2005/0167885 A1* | 8/2005 | Hennessey et al. | 264/295 |
| 2005/0167890 A1* | 8/2005 | Hennessey et al. | 264/403 |
| 2005/0173071 A1* | 8/2005 | Hennessey et al. | 156/510 |
| 2005/0179150 A1* | 8/2005 | Bharadwaj et al. | 264/1.34 |

OTHER PUBLICATIONS

Solvent-Resistant Photocurable "Liquid Teflon" for Microfluidic Device Fabrication; Jason P Rolland, et al; 2004 American chemical society.

Roller Nanoimprint Lithography; J. Vac. Sci. Technol. B 16 (6), Nov./Dec. 1998; 1998 American Vacuum society; p. 3926-3928.

Norland Optical Adhesive 83H; Norland Products; www.gentec.be/noa83h.htm.

Pilot coating Plant; ichemco, continuous coating pilot plant; www.ichemco.it/eng/pilot.htm.

Scientific american: Breaking the Mold, big-name researchers are moving to commercialize nanomanufacturing; by Gary Stix; Jun. 17, 2002.

Yasui,Next Generatio Coaters; the Yasui Seiki " Micro Gravure" coating Method; www.yasui.com; pp. 1-10.

Journal of engineering Mthematics 2002 Kluwer Academic Publishers; Numerical modeling of liquid withdrawal from gravure cavities in coating operations; the effect of cell pattern; Leonard W Schwartz; received Sep. 19, 2001- accepted in revised form Feb. 14, 2002; pp. 243-253.

Coating Techniques by Ferron and Lannoy; by cormaic web design 2000; Gravure Coating.

Modern coating Technology Systems for paper, film and foil; F. shepherd C. eng. M.I.Mech. E; 1995.

* cited by examiner

APPARATUS FOR EMBOSSING A FLEXIBLE SUBSTRATE WITH A PATTERN CARRIED BY AN OPTICALLY TRANSPARENT COMPLIANT MEDIA

FIELD OF THE INVENTION

The present invention relates generally to an apparatus for embossing a flexible substrate. More specifically, the present invention relates to an apparatus for embossing a photopolymer coated flexible substrate with an imprint pattern transferred from an imprint stamp carried by an optically transparent compliant media. The imprint stamp is irradiated through the compliant media with ultraviolet light contemporaneously with the embossing so that the transferred imprint pattern cures, hardens, and retains its shape.

BACKGROUND OF THE INVENTION

Current roll-to-roll soft lithography processes for embossing a photopolymer coated web include a process and apparatus used by Epigem Ltd., wherein a web material that is transparent to ultraviolet light is coated with a layer of photopolymer resist and the coated side of the web is brought into contact with an embossing shim that carries an imprint pattern. When the web separates from the embossing shim, the imprint pattern is embossed in (i.e. is replicated in) the layer of photopolymer resist. An ultraviolet light source irradiates the layer of photopolymer resist through the web and cures the embossed pattern so that the pattern hardens and retains its embossed shape. Because the web is transparent to the ultraviolet light, placement of the ultraviolet light source is not problematic and the embossing shim can be opaque to ultraviolet light and the irradiation can occur from the web side.

One disadvantage of the above apparatus is that if the web material and the embossing shim are opaque to ultraviolet light, then the irradiation will not be effective from the web side or the embossing shim side. Accordingly, if a roll-to-roll process requires the web material to be opaque to ultraviolet light, then the embossing shim must be optically transparent to the ultraviolet light so that the irradiation of the embossed pattern in the layer of photopolymer resist can occur from the embossing shim side.

In contrast, researchers at various universities (e.g. University of Texas at Austin, Step and Flash Imprint Lithography) have used quartz shims (templates) that are optically transparent to ultraviolet light. However, that process is a batch oriented wafer-based process that is not suitable for a roll-to-roll soft lithography process.

Consequently, there is an unmet need for an apparatus for implementing a roll-to-roll soft lithography process wherein an optically transparent compliant media that carries an imprint stamp, is used to emboss a pattern in a photopolymer coated on an opaque flexible substrate. There is also a need for an apparatus that allows the pattern embossed in the flexible substrate to be cured by ultraviolet light that irradiates the pattern through the compliant media and the imprint stamp.

SUMMARY OF THE INVENTION

Broadly, the present invention is embodied in an apparatus for embossing a flexible substrate with a pattern carried by an optically transparent compliant media. The compliant media includes an optically transparent imprint stamp that includes an imprint pattern. The compliant media can be connected with an optically transparent belt material or with an optically transparent cylinder.

The flexible substrate includes a coated side that is coated with a photopolymer material and the coated side is urged into contact with the compliant media so that the imprint pattern carried by the imprint stamp is embossed in the photopolymer material. An ultraviolet light source irradiates the photopolymer material with ultraviolet light that passes through the compliant media and the imprint stamp and impinges on the pattern embossed in the photopolymer material thereby curing the pattern. The curing of the pattern in the photopolymer material occurs contemporaneously with the embossing so that the pattern hardens and retains its shape.

One advantage of the apparatus of the present invention is that the irradiation occurs through the compliant media so that the flexible substrate can be opaque to ultraviolet light.

Another advantage of the present invention is that the ultraviolet light source can be placed inside or outside of the belt material the compliant media is connected with. If a cylinder is used, then the ultraviolet light source can be placed or inside of or outside of the cylinder the compliant media is connected with.

Other aspects and advantages of the present invention will become apparent from the following detailed description, taken in conjunction with the accompanying drawings, illustrating by way of example the principles of the present invention.

DETAILED DESCRIPTION

Figure 1:
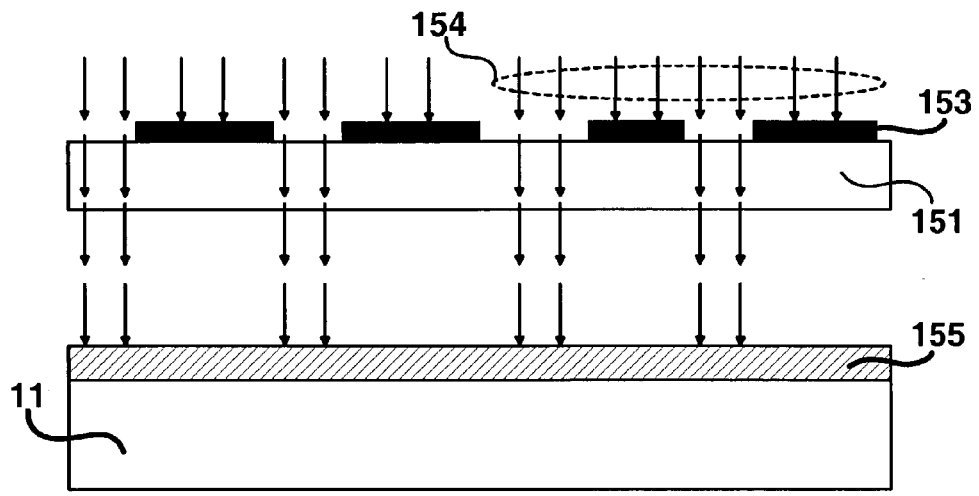
FIGS. 1 through 5 depict patterning and etching a master substrate to define an imprint pattern according to the present invention.

In the following detailed description and in the several figures of the drawings, like elements are identified with like reference numerals.

In FIGS. 38 through 47, an embossing apparatus that includes an optically transparent embossing belt or an optically transparent embossing drum is illustrated.

In FIGS. 1 through 37b, a method of making an optically transparent complaint media that can be connected with an optically transparent belt material or an optically transparent cylinder is illustrated.

As shown in the drawings for purpose of illustration, the present invention is embodied in an embossing apparatus. In one embodiment of the present invention, the embossing apparatus includes a flexible substrate with a coated side and a base side, a coating unit for depositing a photopolymer material having a first thickness on the coated side of the flexible substrate, and an embossing belt including an optically transparent belt material and an optically transparent complaint media that is connected with the belt material. The compliant media includes an optically transparent imprint stamp with an imprint pattern that will be embossed in the photopolymer material on the coated side to form a replicate pattern in the photopolymer material. A plurality of transport rollers are connected with the belt material and are operative to support the embossing belt.

A drive unit imparts a drive motion to the embossing belt and the flexible substrate so that the coated side is brought into contact with the imprint stamp and the imprint pattern is replicated in the photopolymer material. A backing drum is wrapped by a portion of the base side of the flexible substrate and by a portion of the compliant media so that a tension is imparted in the embossing belt and that tension generates a pressure between the flexible substrate and the embossing belt.

The drive motion is operative to transport the base side of the flexible substrate over the backing drum and to urge the imprint stamp and the coated side into contact with each other so that the imprint pattern is embossed in the photopolymer material to form the replicate pattern in the photopolymer material. An ultraviolet light source irradiates the replicate pattern with ultraviolet light that passes through the belt material, the compliant media, and the imprint stamp. The irradiation of the replicate pattern occurs contemporaneously with the embossing of the replicate pattern so that the replicate pattern cures, hardens, and retains its shape.

In an alternative embodiment of the present invention, the embossing apparatus includes a flexible substrate with a coated side and a base side, a coating unit for depositing a photopolymer material having a first thickness on the coated side of the flexible substrate, and an embossing drum that includes an optically transparent cylinder and an optically transparent complaint media that is connected with the cylinder. The compliant media includes an optically transparent imprint stamp with an imprint pattern that will be embossed in the photopolymer material on the coated side to form a replicate pattern in the photopolymer material.

A drive unit imparts a drive motion to the embossing drum and the flexible substrate so that the coated side is brought into contact with the imprint stamp and the imprint pattern is replicated in the photopolymer material. A plurality of transport rollers are connected with the base side and are operative to conformally wrap the coated side over a portion of the embossing drum so that the embossing drum imparts a tension in the flexible substrate and that tension generates a pressure between the flexible substrate and the embossing drum.

The drive motion is operative to transport the coated side over the embossing drum and to urge the imprint stamp and the coated side into contact with each other so that the imprint pattern is embossed in the photopolymer material to form the replicate pattern in the photopolymer material. An ultraviolet light source irradiates the replicate pattern with ultraviolet light that passes through the cylinder, the compliant media, and the imprint stamp. The irradiation of the replicate pattern occurs contemporaneously with the embossing of the replicate pattern so that the replicate pattern cures, hardens, and retains its shape.

Figure 37A:
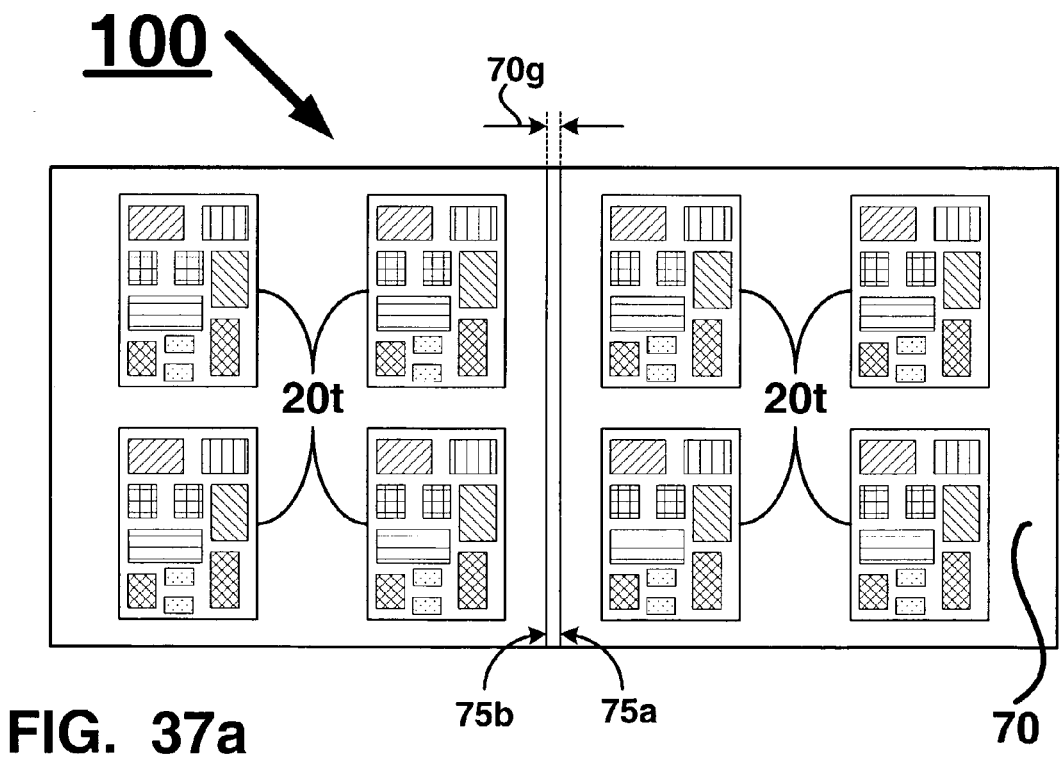
Figure 37B:
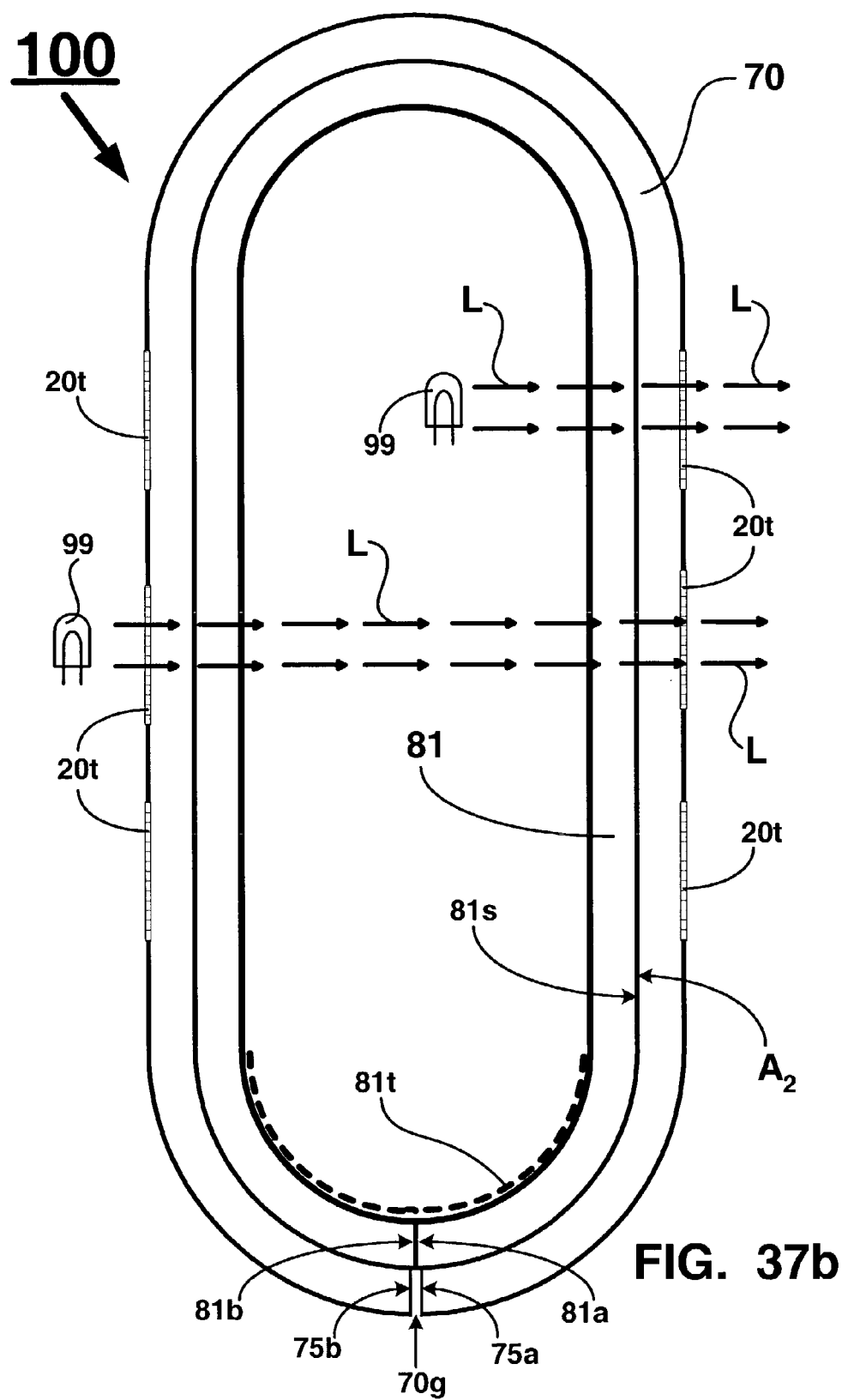
Figure 38:
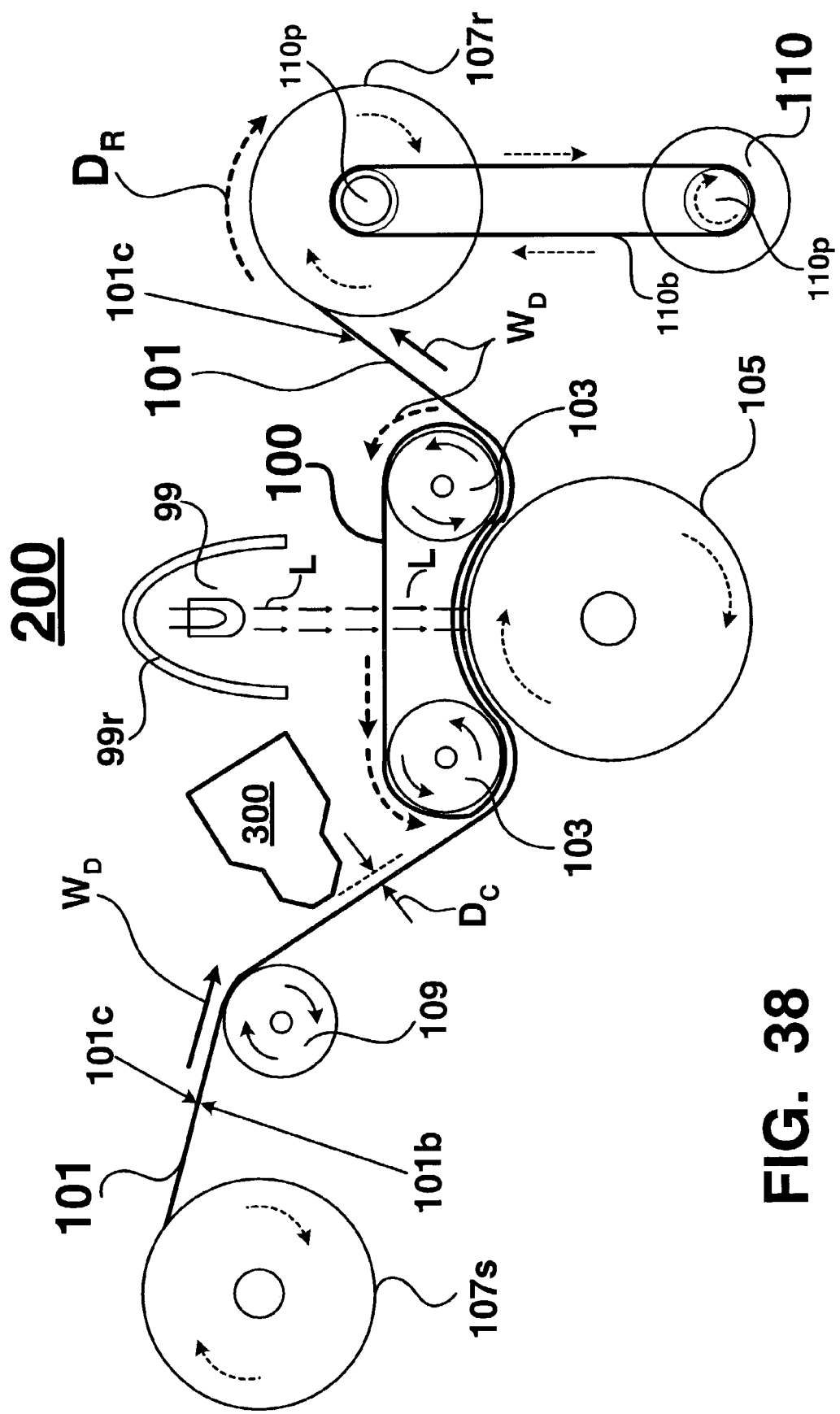
FIGS. 38 and 39 are schematics depicting an apparatus for embossing a flexible substrate using an optically transparent compliant media connected with an optically transparent belt material according to the present invention.
Figure 39:
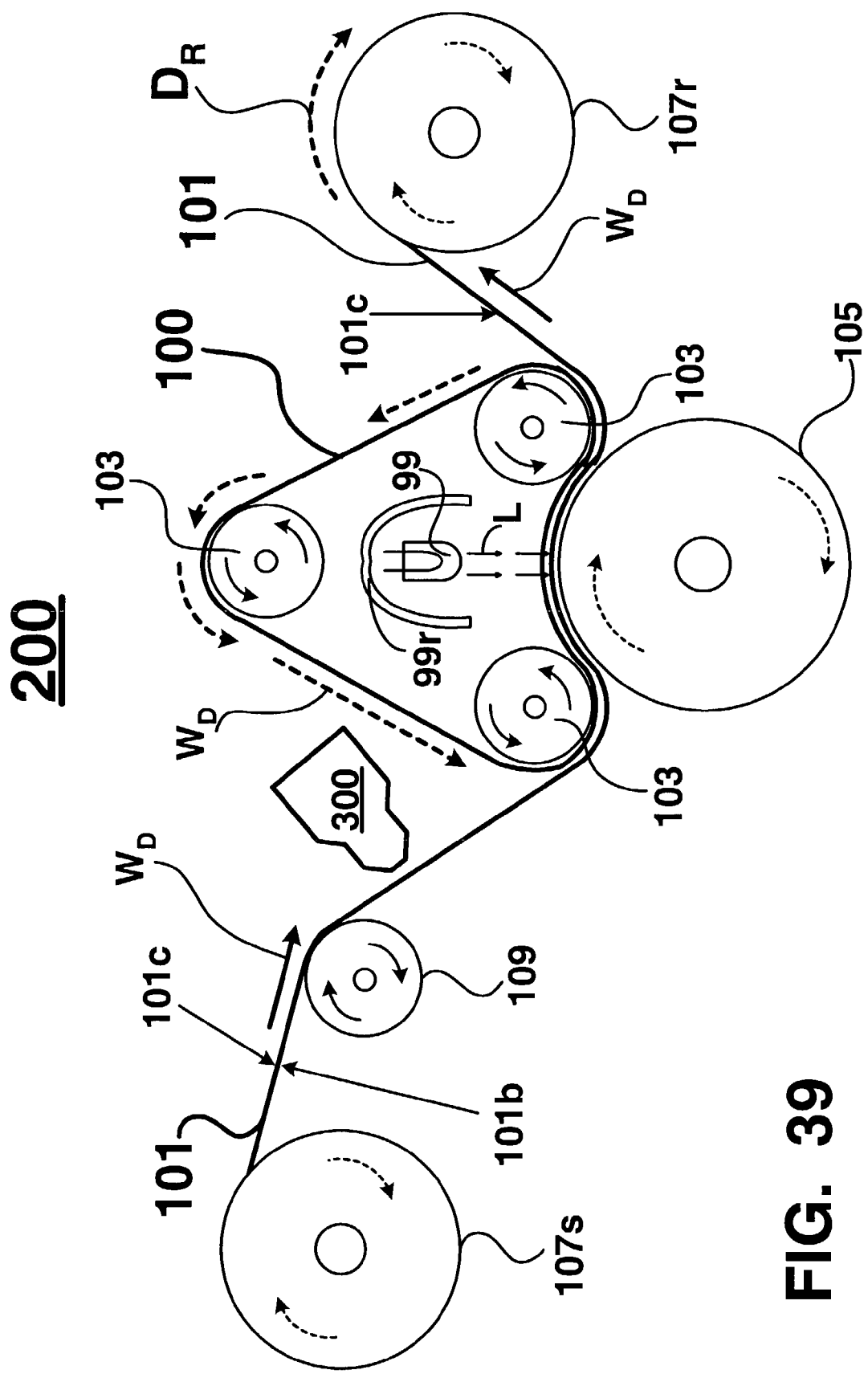

In FIG. 38, an embossing apparatus 200 includes a flexible substrate 101 that includes a coated side 101c and a base side 101b. A coating unit 300 is operative to deposit a photopolymer material 301 (see FIGS. 42, 43, and 44) on the coated side 101c. The photopolymer material 301 has a first thickness $t_c$. An embossing belt 100 includes an optically transparent belt material 81 and an optically transparent compliant media 70 that is connected with the belt material 81 (see FIG. 45). The complaint media 70 also includes an optically transparent imprint stamp 20t that includes an imprint pattern 20q (see FIG. 29). Because the imprint pattern 20q is formed from the same material as the imprint stamp 20t, the imprint pattern 20q is also optically transparent. FIG. 45 and FIGS. 37*a* and 37*b* provide a more detailed view of the embossing belt 100 than is depicted in FIGS. 38 and 39.

A plurality of transport rollers 103 are connected with the belt material 81 and are operative to support the embossing belt 100. A drive unit 110 imparts a drive motion $W_D$ to the embossing belt 100 and the flexible substrate 101. As will be described below, the drive unit 110 can be connected with the embossing apparatus 200 in a variety of ways to accomplish the drive motion $W_D$.

A backing drum 105 is wrapped by a portion of the base side 101*b* of the flexible substrate 101 and by a portion of the compliant media 70 so that a tension is imparted to the embossing belt 100 and the flexible substrate 101. The tension generates a pressure between the flexible substrate 101 and the embossing belt 100. The pressure is operative to effectuate the embossing of the imprint stamp 20*t* in the photopolymer material 301. The drive motion $D_R$ is operative to transport the base side 101*b* over the backing drum 105 and to urge the imprint stamp 20*t* and the coated side 101*c* into contact with each other so that the imprint pattern 20*q* is embossed in the photopolymer material 301 and forms a replicate pattern 20*u* (see FIG. 47) in the photopolymer material 301.

An ultraviolet light source 99 irradiates the replicate pattern 20*u* with an ultraviolet light L that passes through the belt material 81 and the imprint stamp 20*t*. The irradiating of the replicate pattern 20*u* occurs contemporaneously with the embossing of the replicate pattern 20*u* so that the replicate pattern 20*u* cures, hardens, and retains its shape. The replicate pattern 20*u* includes a plurality of patterns 20*v* therein that complement the patterns 20*p* on the master substrate 11 (see FIGS. 5 and 6).

The ultraviolet light source 99 can include a reflector 99*r* that focuses the ultraviolet light L at a point where the imprint stamp 20*t* is urged into contact with the coated side 101*c* so that the photopolymer material 301 is not cured by the ultraviolet light L before the imprint pattern 20*q* is embossed in the photopolymer material 301. In FIG. 45, the reflector 99*r* (not shown) creates a curing window $C_W$ that focuses the ultraviolet light L at an area where the replicate pattern 20*u* will be embossed and almost simultaneously cured. The reflector 99*r* is also operative to prevent a leakage of the ultraviolet light L that could potentially impinge on the photopolymer material 301 and cause it to cure before it is embossed by the imprint stamp 20*t*.

One advantage of the present invention is that the embossing apparatus 200 is effective at embossing and curing the photopolymer material 301 when the flexible substrate 101 is opaque to the ultraviolet light L because the irradiation of the replicate pattern 20*u* occurs through the embossing belt 100 as opposed to through the flexible substrate 101. Accordingly, the embossing apparatus 200 of the present invention can be used to emboss and cure the photopolymer material 301 on an opaque flexible substrate 101 or on an optically transparent flexible substrate 101. Because some application will require that the material for the flexible substrate 101 be an opaque material, the embossing apparatus 200 of the present invention allows for flexibility in the selection of materials for the flexible substrate 101.

The ultraviolet light source 99 can be a UVA ultraviolet light source, preferably an industrial grade UVA light source as it is desirable to cure the replicate pattern 20*u* in a very short period of time that is on the order of about 0.1 second to about 6.0 seconds. Preferably, the ultraviolet light L has a wavelength from about 300.0 nm to about 400.0 nm. Intensities for the ultraviolet light source 99 will also be application dependent; however, as an example, intensities in a range from about 200.0 mW/cm$^2$ to about 1000.0 mW/cm$^2$ can be used. As another example, Norland™ Optical Adhesives require about 0.2 Joules/cm$^2$ total energy to cure.

In that the irradiation of the photopolymer material 301 occurs through the embossing belt 100, the ultraviolet light source 99 can have a position relative to the embossing belt 100 that includes a position inside the embossing belt 100 as depicted in FIGS. 39 and 45 and a position outside of the embossing belt 100 as depicted in FIGS. 38 and 45. When the ultraviolet light source 99 is positioned outside of the embossing belt 100 as in FIG. 38, it may be necessary to take into account a slight attenuation in an intensity of the ultraviolet light L due to the ultraviolet light L passing through two layers of the embossing belt 100 as opposed to one layer when the ultraviolet light source 99 is positioned inside the embossing belt 100. Accordingly, it may be necessary to use a higher intensity ultraviolet light source 99 when the ultraviolet light source 99 is positioned outside the embossing belt 100.

In FIG. 39, three transport rollers 103 are used in order to create a space to accommodate the ultraviolet light source 99 on the inside of the embossing belt 100. However, because the compliant media 70 can be made to any size, there are a variety of ways to accommodate the ultraviolet light source 99 on the inside of the embossing belt 100 including making the embossing belt 100 longer and making a diameter of the transport rollers 103 larger in order to create a large enough space to accommodate the ultraviolet light source 99. Therefore, the embodiment of FIG. 39 is just one example of how to accommodate the ultraviolet light source 99 on the inside of the embossing belt and other configurations are also possible and the present invention is not limited to the configuration illustrated in FIG. 39.

Figure 42:
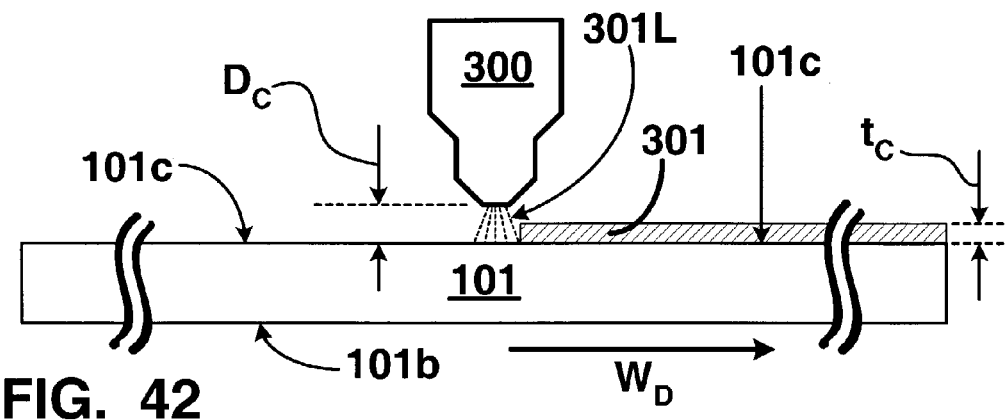
FIG. 42 is a schematic of a coating unit according to the present invention.

In FIG. 42, the coating unit 300 is operative to deposit the photopolymer material 301 on the coated side 101*c* with the first thickness $t_c$. Typically, the photopolymer material 301 is supplied in a liquid form 301L prior to the depositing on the coated side 101*c*. During the drive motion $W_D$, it is important that a coating distance $D_c$ between the coated side 101*c* and the coating unit 300 be accurately maintained so that the first thickness $t_c$ does not vary and the photopolymer material 301 is deposited as a smooth and uniform layer on the coated side 101*c*. The photopolymer material 301 can include but is not limited to a Norland™ Optical Adhesive that cures when exposed to ultraviolet light. Preferably, the photopolymer material will cure in a time from about 0.1 seconds to about 6.0 seconds. For example, a Norland® NOA 83H photopolymer can be used for the photopolymer material 301. The photopolymer material 301 can also be a photo resist material.

Optionally, the embossing apparatus 200 can include a guide roller 109 that is operative to maintain the constant distance $D_c$ between the coated side 101*c* and the coating unit 300 so that the first thickness $t_c$ of the photopolymer material 301 is accurately maintained. The guide roller 109 is particularly useful when a supply reel 107*s* is used to carry and dispense the flexible substrate 101. As the flexible substrate 101 is spooled off of the supply reel 107*s*, its distance from the coating unit 300 can vary and will increase as a wound diameter of the flexible substrate 101 decreases as the flexible substrate 101 is wound off of the supply reel 107*s*. Accordingly, the guide roller 109 controls the distance between the coated side 101*c* and the coating unit 300.

The first thickness $t_c$ of the photopolymer material 301 will be application dependent and the type of coating unit 300 will also be application dependent. The first thickness $t_c$ is generally comparable to the typical feature height (see $h_0$ in FIG. 4) in order to minimize embossing residue for subsequent etching of the embossed layer. For example, if the imprint stamps 20t include imprint patterns 20q that are of a nanometer scale (e.g. less than 1.0 μm and preferably less than 100.0 nm), then it is desirable to deposit a very thin layer of the photopolymer material 301. Preferably, the first thickness $t_c$ is in a range from about 0.05 μm to about 2.0 μm.

A coating technology capable of depositing a uniform and thin layer of the photopolymer material 301 and that can be used for the coating unit 300 includes but is not limited to a Gravure Coater, a Micro Gravure™ Coater, and a Slot Die Coater. For example, the above mentioned range of thicknesses for the first thickness $t_c$ can be obtained using a Yasui Seiki™ Micro Gravure™ Coater. The photopolymer material 301 can be thinned with a solvent, such as acetone, to achieve a thinner coating for the first thickness $t_c$.

Figure 43:
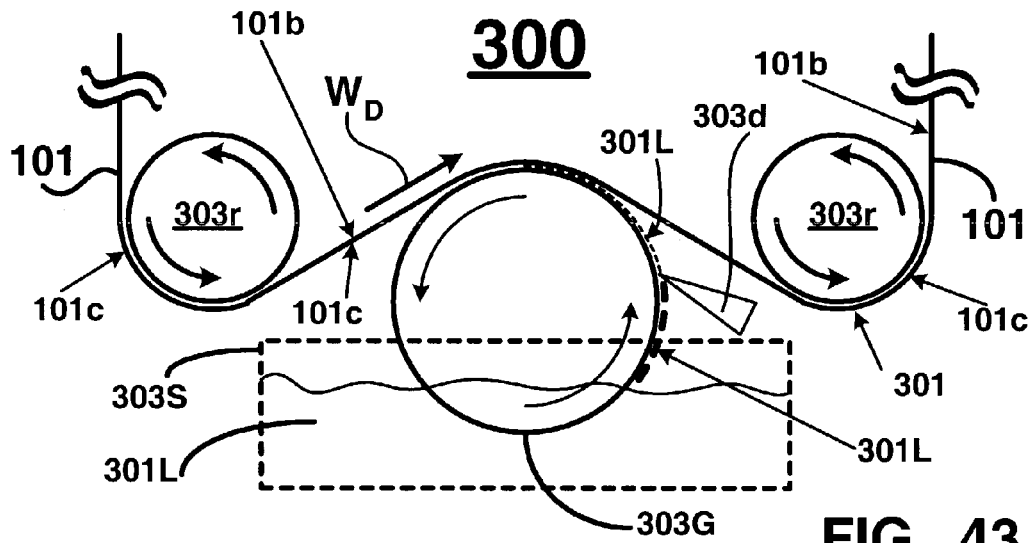
FIG. 43 is a schematic of a coating unit that includes a Gravure type coater according to the present invention.

In FIG. 43, the coating unit 300 can be a Gravure Coater or a Micro Gravure™ Coater. A pair of rollers 303r conformally wrap a portion of the coated side 101c of the flexible substrate 101 over an engraved drum 303g that rotates in a tub 303s that contains a liquid photopolymer material 301L. The photopolymer material 301L is gathered on patterns on a surface of the drum 303g. A doctor blade 303d wipes off an excess of the photopolymer material 301L so that a thin and uniform layer is deposited on the coated side 101c. Preferably, a Micro Gravure™ Coater is used as it has a drum 303g with a smaller diameter than that of a Gravure Coater and is better suited to depositing ultra-thin layers of the photopolymer material 301.

Figure 44:
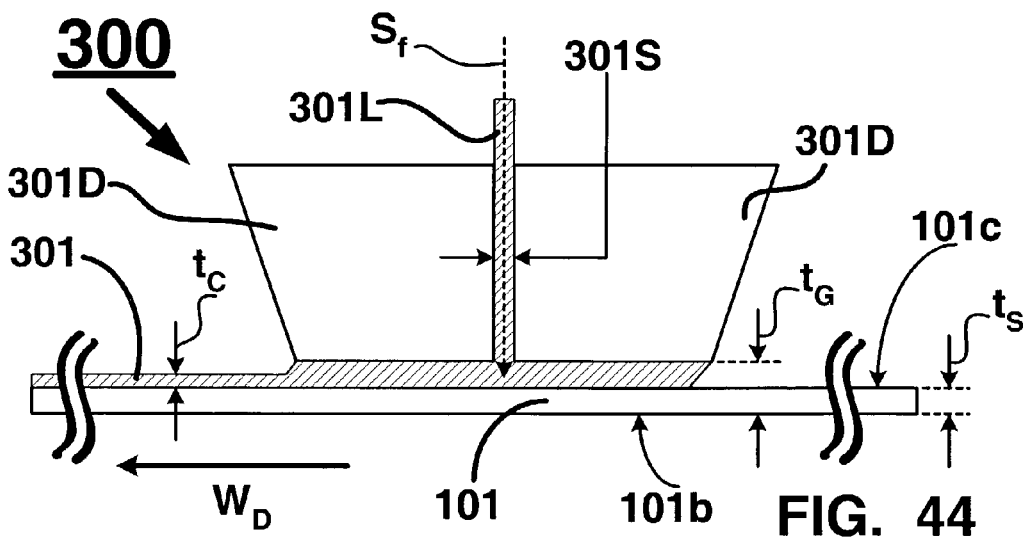
FIG. 44 is a schematic of a coating unit that includes a Slotdie coater according to the present invention.
Figure 45:
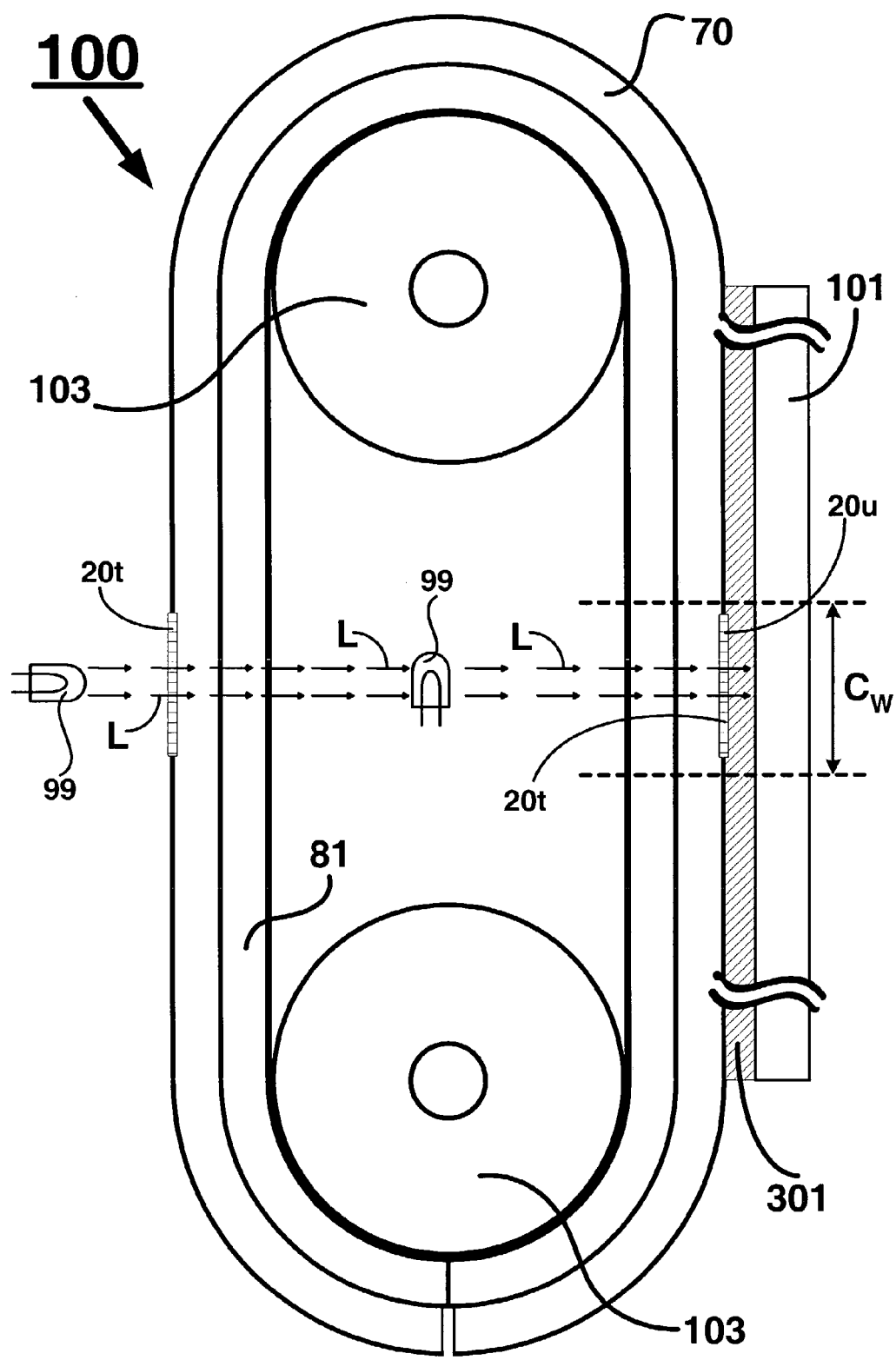
FIG. 45 is a cross-sectional view depicting an irradiation of a photopolymer material through an optically transparent belt material, compliant media, and imprint stamp according to the present invention.

Alternatively, in FIG. 44 a Slot Die Coater can be used to deposit the photopolymer material 301. The liquid photopolymer material 301L is supplied $S_f$ under pressure to a die slot 301S formed by a pair of die lips 301D. The die lips 301D are positioned above the flexible substrate 101 by a coating gap $t_G$ that includes a thickness $t_S$ of the flexible substrate 101. As the coated side 101c of the flexible substrate 101 passes under the die slot 301S, the liquid photopolymer material 301L coats the coated side 101c to the first thickness $t_C$.

The drive motion $t_C$ can be accomplished using a variety of techniques that are well understood in the coating art and the mechanical art. As one example, in FIG. 38, a drive unit 110 mechanically communicates with a takeup reel 107r that is operative to collect the flexible substrate 101 after it has been embossed and cured as described above.

The takeup reel 107r can be connected with the drive unit 110 using a drive belt 110b that imparts a rotation $D_R$ to the takeup reel 107r which in turn collects the flexible substrate 101 on the takeup reel 107r and imparts the drive motion $W_D$ to the flexible substrate 101 and the embossing belt 100. Although a drive belt 110b is depicted, any means for mechanically communicating a drive force including gears, direct drive, pulleys, shafts, and the like can be used. The drive unit 110 can be an electric motor, for example.

One or more of the drive units 110 may be used to impart the drive motion $W_D$ and those drive units 110 can be connected with one or more of the components of the embossing apparatus 200, such as one or more of the transport rollers 103 so that the drive unit 110 rotates the transport roller 103 which in turn imparts the drive motion $W_D$ to the flexible substrate 101 and the embossing belt 100.

The compliant media 70 can be made from an optically transparent silicone-based elastomer material that is laminated to an optically transparent transfer adhesive layer as will be described below in reference to FIGS. 1 through 37b.

Suitable materials for the silicone-based elastomer material (see reference numeral 44 in FIG. 22) include but are not limited to Polydimethyl Siloxane (PDMS), DOW CORNING® silicone-based conformal coatings including SYLGARD 182® silicone elastomer, SYLGARD 183® silicone elastomer, SYLGARD 184® silicone elastomer, and SYLGARD 186® silicone elastomer.

A suitable optically transparent material for the transfer adhesive layer (see reference numeral 51 in FIG. 27) includes but is not limited to an Adhesives Research, Inc.® ARclear® DEV-8932 optically clear silicone adhesive. For instance, a 25.0 μm thick sheet (i.e the seventh thickness $t_7$=25.0 μm) of ARclear® DEV-8932 can be used for the transfer adhesive layer 51.

Figure 40:
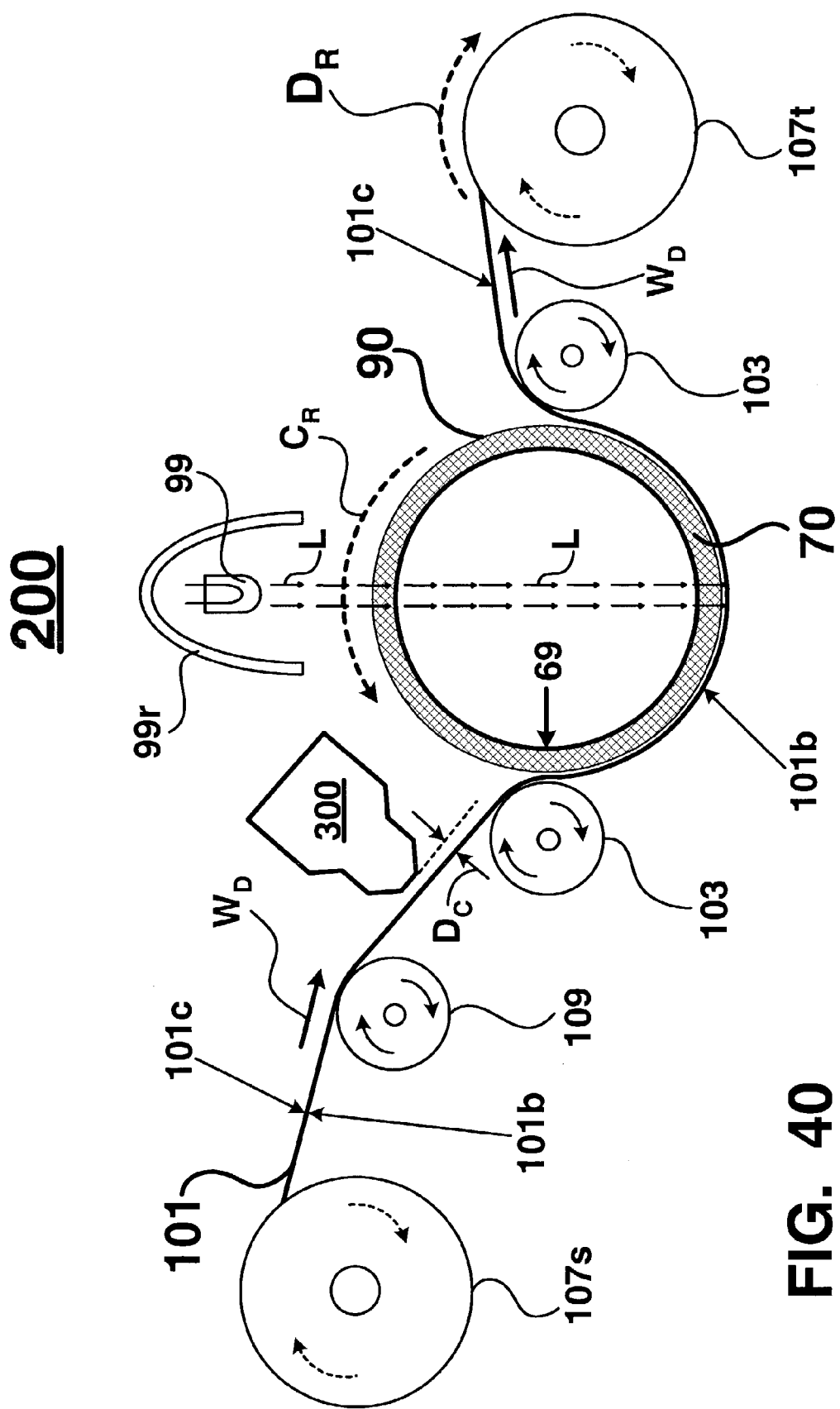
FIGS. 40 and 41 are schematics that depict an apparatus for embossing a flexible substrate using an optically transparent compliant media connected with an optically transparent cylinder according to the present invention.
Figure 41:
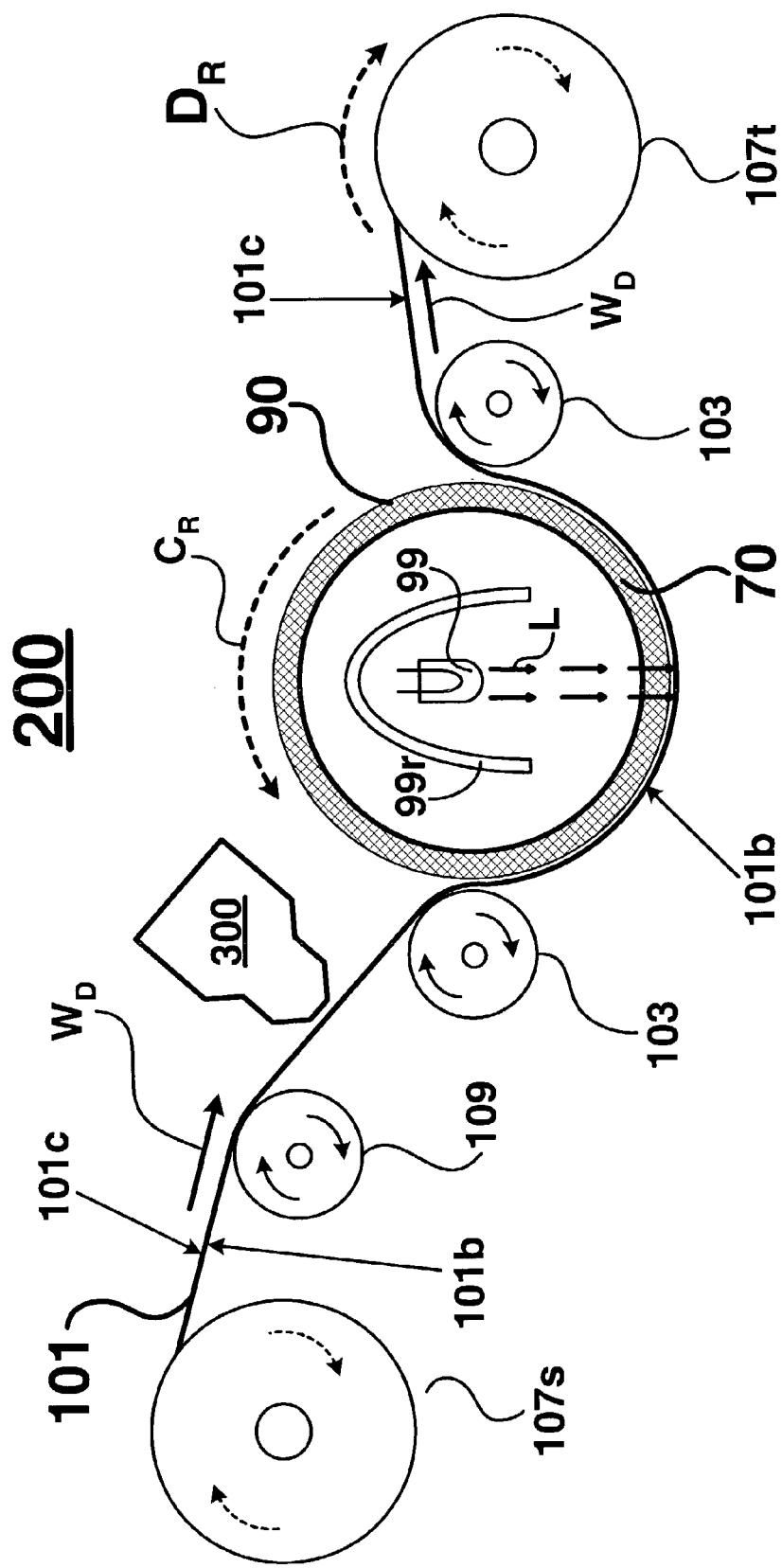
Figure 46:
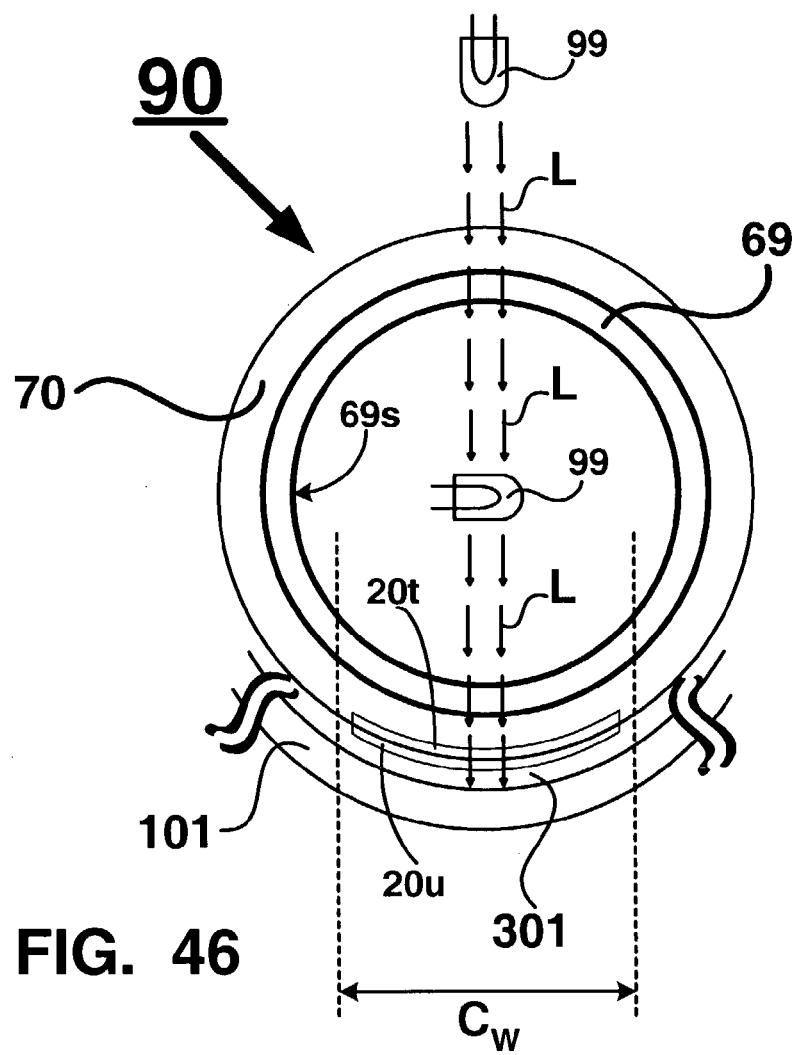
FIG. 46 is a cross-sectional view depicting an irradiation of a photopolymer material through an optically transparent cylinder, compliant media, and imprint stamp according to the present invention.
Figure 47:
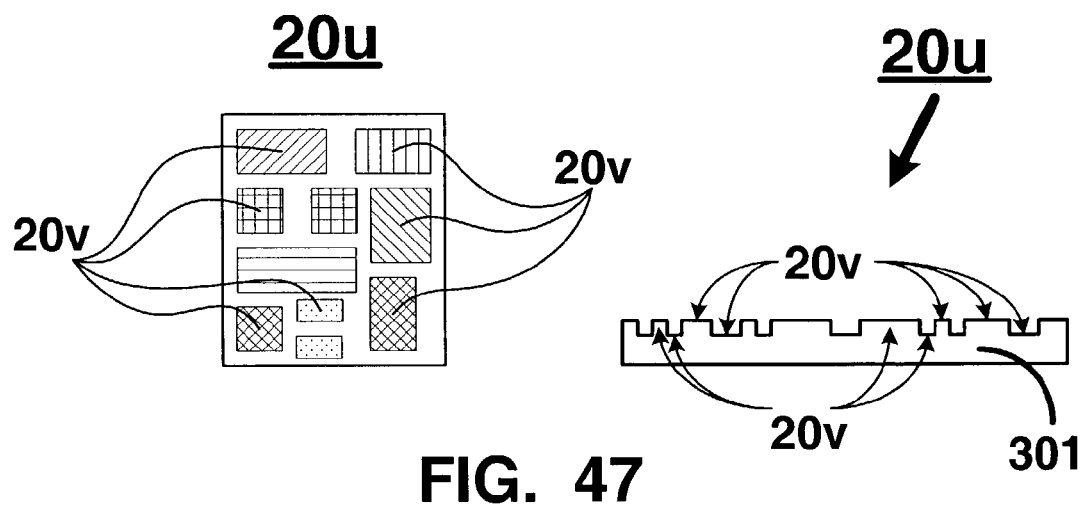
FIG. 47 is a top plan view and a cross-sectional view of a replicate pattern embossed in a photopolymer material according to the present invention.

The belt material 81 can be an optically transparent material so that light L can pass though the belt material 81, the compliant media 70, and the imprint stamp 20t. Suitable optically transparent materials for the belt material 81 include but are not limited to a Polyester film and Mylar®. Although a thickness of the belt material 81 will vary based on the application, a suitable range for the thickness of the belt material 81 that will result in a flexible belt when connected with the compliant media 70 is from about 50.0 μm to about 150.0 μm In an alternative embodiment of the present invention, as illustrated in FIGS. 40, 41, and 46, the embossing apparatus 200 includes an embossing drum instead of the aforementioned embossing belt 100. The embossing apparatus 200 includes the flexible substrate 101, the coating unit 300, and an embossing drum 90 that includes an optically transparent cylinder 69 and the optically transparent complaint media 70 that is connected with the cylinder 69. As described above, the complaint media 70 includes the optically transparent imprint stamp 20t with the imprint pattern 20q therein. FIG. 46 and FIGS. 32 through 34b provide a more detailed view of the embossing drum 90 than is depicted in FIGS. 40 and 41.

Also as described above, a drive unit 110 imparts a drive motion $W_D$ to the embossing drum 90 and the flexible substrate 101. The embossing apparatus 200 can include the above mentioned guide roller 109 for maintaining the constant distance $D_C$, the supply reel 107s, and the takeup reel 107t. The drive unit 110 may drive the takeup reel 107t and/or one or more of the transport rollers 103. Alternatively, the embossing drum 90 may be driven by the drive unit 110; however, care should be taken to avoid slippage between the compliant media 70 and the flexible substrate 101.

A plurality of the transport rollers 103 are connected with the base side 101b of the flexible substrate 101 and are operative to conformally wrap the coated side 101c over a portion of the embossing drum 90 so that the embossing drum 90 imparts a tension in the flexible substrate 101 and that tension generates a pressure between the flexible substrate 101 and the embossing drum 90. The pressure is operative to effectuate the embossing of the imprint stamp 20t in the photopolymer material 301.

The drive motion $W_D$ transports the coated side 101c over the embossing drum 90 and urges the imprint stamp 20t into contact with the coated side 101c so that the imprint pattern 20q is embossed in the photopolymer material 301 to form the replicate pattern 20u in the photopolymer material 301. In FIG. 46, the compliant media 70 forms an outer surface of the embossing drum 90 so that the coated side 101c comes into contact with the compliant media 70 and the imprint stamp 20t as the flexible substrate 101 is transported over the wrapped portion of the embossing drum 90.

The ultraviolet light source 99 irradiates the replicate pattern 20u with the ultraviolet light L that passes through the cylinder 69 and the imprint stamp 20t. The irradiating of the replicate pattern 20u occurs contemporaneously with the embossing of the replicate pattern 20u.

As previously described, the flexible substrate 101 can be opaque to the ultraviolet light L. In FIGS. 40, 41, and 46, the ultraviolet light source 99 can be positioned inside the embossing drum 90 or outside the embossing drum 90. It may be necessary to increase an intensity of the ultraviolet light source 99 if the ultraviolet light source 99 is positioned outside of the embossing drum 90 because the ultraviolet light L must pass through two layers of the cylinder 69 and the compliant media 70 and some attenuation of the ultraviolet light L may occur.

The ultraviolet light source 99 can include the reflector 99r as described above and the reflector 99r can create the curing window $C_W$ (see FIG. 46). The ultraviolet light source 99 can be a UVA light source and the ultraviolet light L can have a wavelength from about 300.0 nm to about 400.0 nm.

The same materials as described above for the embossing belt 100 can be used for the embossing drum 90; however, the cylinder 69 can be an optically transparent material including but not limited to a glass, a plastic, and quartz.

The aforementioned Gravure Coater, Micro Gravure™ Coater, or Slot Die Coater can be used for the coating unit 300 and the first thickness $t_c$ of the photopolymer material 301 can be in a range from about 0.5 μm to about 1.0 μm.

The embossing belt 100 and the embossing drum 90 can be made using a method described below in reference to FIGS. 1 through 37b.

In FIGS. 1 through 4, a master substrate 11 is patterned and then etched to form an imprint pattern 20 therein. In FIG. 1, the master substrate 11 is coated with a material 155 that will serve as an etch mask. The material 155 can be a photoresist material that is commonly used in the microelectronics art. A mask 151 that carries a pattern 153 to be formed in the master substrate 11 is illuminated with light 154 which exposes the material 155 with the pattern 153.

Figure 2:
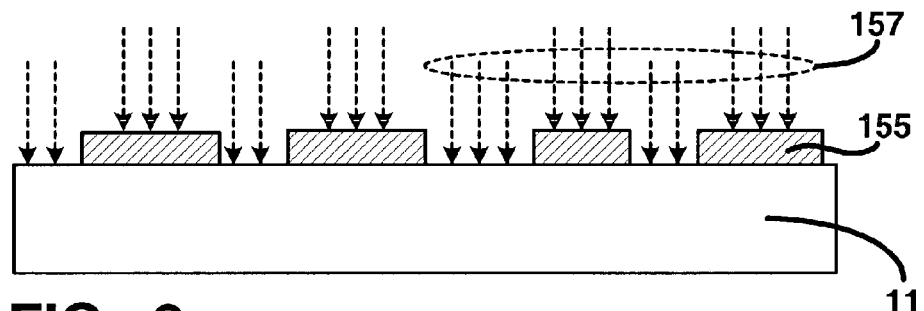
Figure 3:
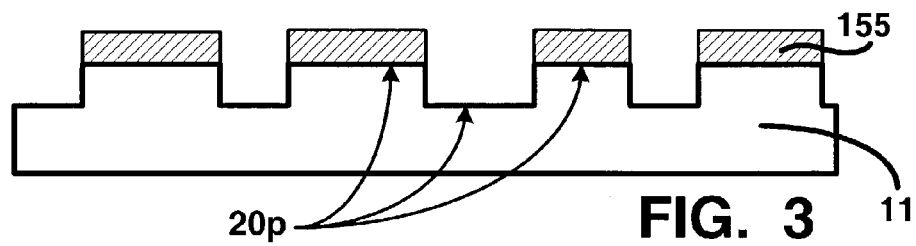
Figure 4:
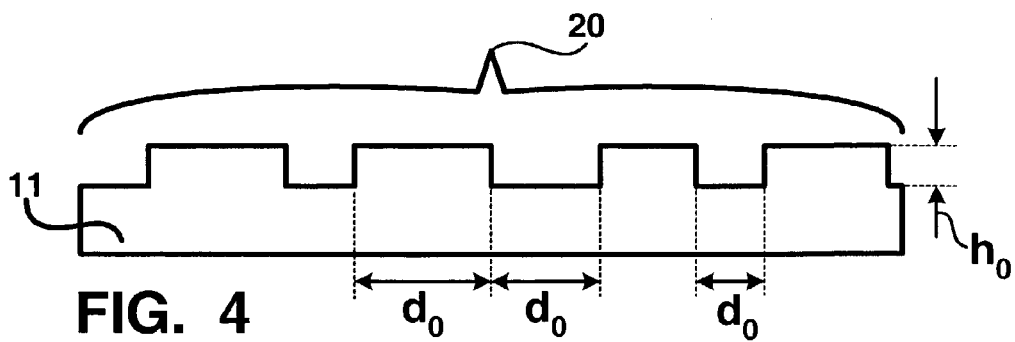

In FIG. 2, the material 155 is developed to remove those portions of the material 155 that were exposed to the light 154. In FIGS. 2 and 3, the master substrate 11 is etched with an etch material to remove those portions of the master substrate 11 that are not covered with the material 155. As a result, in FIG. 3, a plurality of imprint patterns 20p are formed in the master substrate 11. In FIG. 4, the imprint patterns 20p define an imprint stamp 20 on the master substrate 11.

The imprint stamp 20 can include imprint patterns 20p that vary in all three dimensions of width, length, and height. In the cross-sectional view of FIG. 4 and the top plan view of FIG. 5, the imprint patterns 20p vary in a width dimension $d_0$, a height dimension $d_0$, and a length dimension $L_0$. The actual dimensions of the imprint patterns 20p will be application dependent and will depend to a large extent on the lithography process used for the patterning the material 155. For example, if a state-of-the-art microelectronics lithography process is used, then the dimensions ($d_0$, $h_0$, $L_0$) can be of a sub-micrometer scale, that is, less than 1.0 μm. For instance, the imprint patterns 20p can be nano-imprint patterns that can have dimensions ($d_0$, $h_0$, $L_0$) of 100.0 nm or less. Accordingly, the imprint stamp 20 would be a nano-imprint stamp with imprint patterns 20p that have nanometer-size dimensions ($d_0$, $h_0$, $L_0$).

Lithography processes that are well understood in the microelectronics art can be used to pattern and etch the master substrate 11. For example, a photolithography process using a photoresist for the material 155 and an etch process such as reactive ion etching (RIE) can be used to form the imprint stamp 20 in the master substrate 11.

Figure 5:
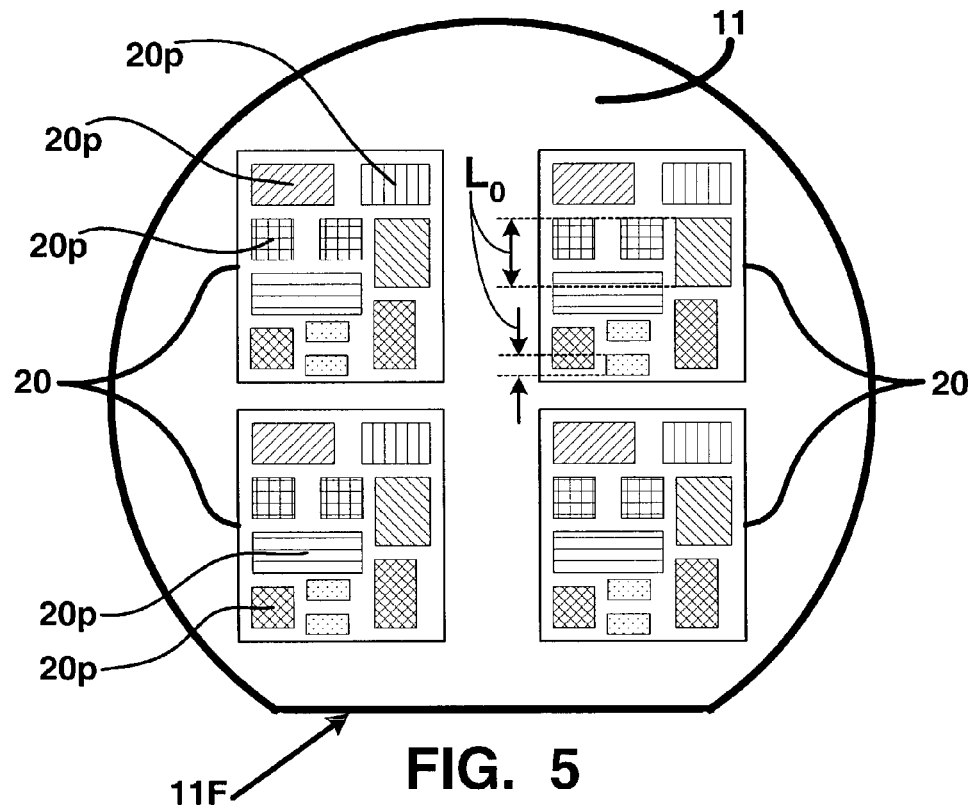

Suitable materials for the master substrate 11 include but are not limited to a silicon (Si) substrate and a silicon (Si) wafer. In FIG. 5, the master substrate 11 is a silicon wafer with a wafer flat 11F. Four of the imprint stamps 20 are formed in the master substrate 11. The silicon wafer can be any size. For example a 4.0 inch silicon wafer was used as the master substrate 11 for four of the imprint stamps 20. Larger diameter silicon wafers (e.g. 8 inch or 12 inch) can be used to provide a larger surface area for more of the imprint stamps 20 or for larger imprint stamps 20. Although the imprint patterns 20p appear to be identical in FIG. 5, the imprint stamps 20 can include imprint patterns 20p that vary (i.e are not identical) among the imprint stamps 20.

Figure 6:
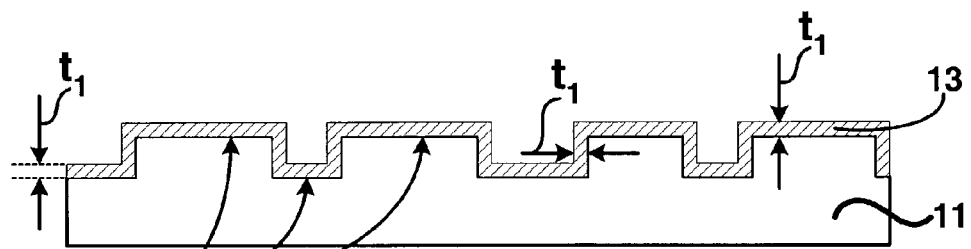
FIG. 6 depicts a release layer conformally deposited on an imprint pattern according to the present invention.

In FIG. 6, a release layer 13 is deposited over the imprint patterns 20p. The release layer 13 includes a first thickness $t_1$ that is operative to conformally coat the imprint patterns 20p such that the first thickness $t_1$ is substantially equally thick on the vertical and the horizontal surfaces of the imprint patterns 20p. Suitable materials for the release layer 13 include but are not limited to a fluorocarbon material. As an example, the fluorocarbon material for the release layer 13 can be deposited using a plasma deposition of a trifluoromethane ($CHF_3$) gas for about 5.0 minutes.

The first thickness $t_1$ will be application dependent; however, as will be discussed below, the release layer 13 is operative to provide a non-stick surface upon which to apply a silicone-based elastomer material that will later be released from the release layer 13. Therefore, the release layer 13 can be a very thin layer having a first thickness $t_1$ that is from about 50.0 nm to about 150.0 nm thick.

Figure 7:
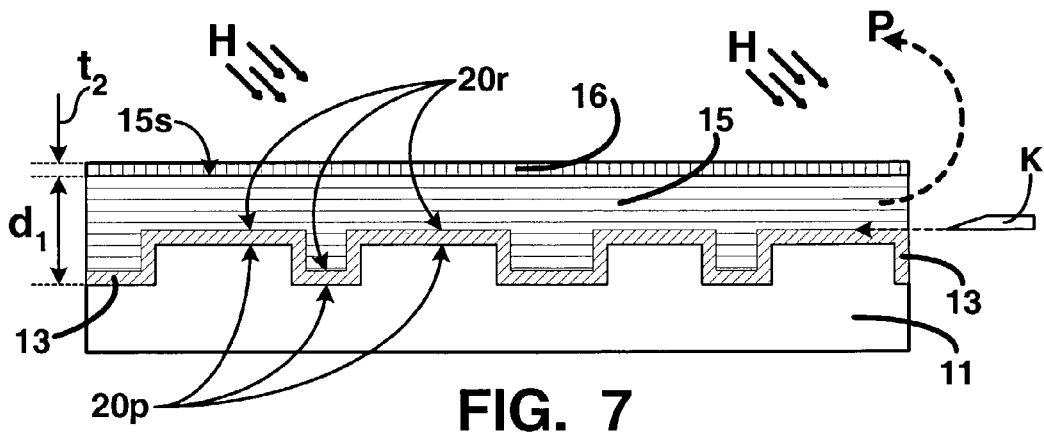
FIG. 7 depicts a silicon-based elastomer layer deposited over a release layer according to the present invention.

In FIG. 7, a silicone-based elastomer layer 15 is deposited over the release layer 13 to a first depth $d_1$ that completely covers the imprint patterns 20p. To obtain a uniform thickness for the silicone-based elastomer layer 15, the master substrate 11 should be substantially level. This can be accomplished by placing the master substrates 1 on a level surface or a level vacuum chuck prior to depositing the silicone-based elastomer layer 15, for example.

The silicone-based elastomer layer 15 is then cured by heating H the master substrate 11. The curing can be accomplished by baking the master substrate 11 at a predetermined temperature for a predetermined amount of time. The actual time and temperature will be application dependent and will also depend on the type of material used for the silicone-based elastomer layer 15. Suitable materials for the silicone-based elastomer layer 15 include but are not limited to Polydimethyl Siloxane (PDMS), DOW CORNING® silicone-based conformal coatings including SYLGARD® 182 silicone elastomer, SYLGARD® 183 silicone elastomer, SYLGARD® 184 silicone elastomer, and SYLGARD® 186 silicone elastomer.

The first depth $d_1$ of the silicone-based elastomer layer 15 can be application dependent. However, in a preferred embodiment, the first depth $d_1$ of the silicone-based elastomer layer 15 is from about 0.5 mm to about 1.5 mm. For PDMS or the DOW CORNING® SYLGARD® silicone-based elastomers, the curing of the silicone-based elastomer layer 15 can be accomplished by baking the master substrate 11 in an oven or the like. The predetermined temperature and the predetermined amount of time for the curing can be for about 4.0 hours at a temperature of about 100.0° C.

In an alternative embodiment, also illustrated in FIG. 6, prior to the above mentioned curing step, a cover layer 16 having a second thickness $t_2$ is applied over the already deposited silicone-based elastomer layer 15. Preferably, the cover layer 16 is a Polyester film and the second thickness $t_2$ is from about 50.0 µm to about 150.0 µm. The cover layer 16 may be used to planarize any surface anomalies in the silicone-based elastomer layer 15 that cause deviations from a substantially planar surface 15s of the silicone-based elastomer layer 15.

Figure 8:
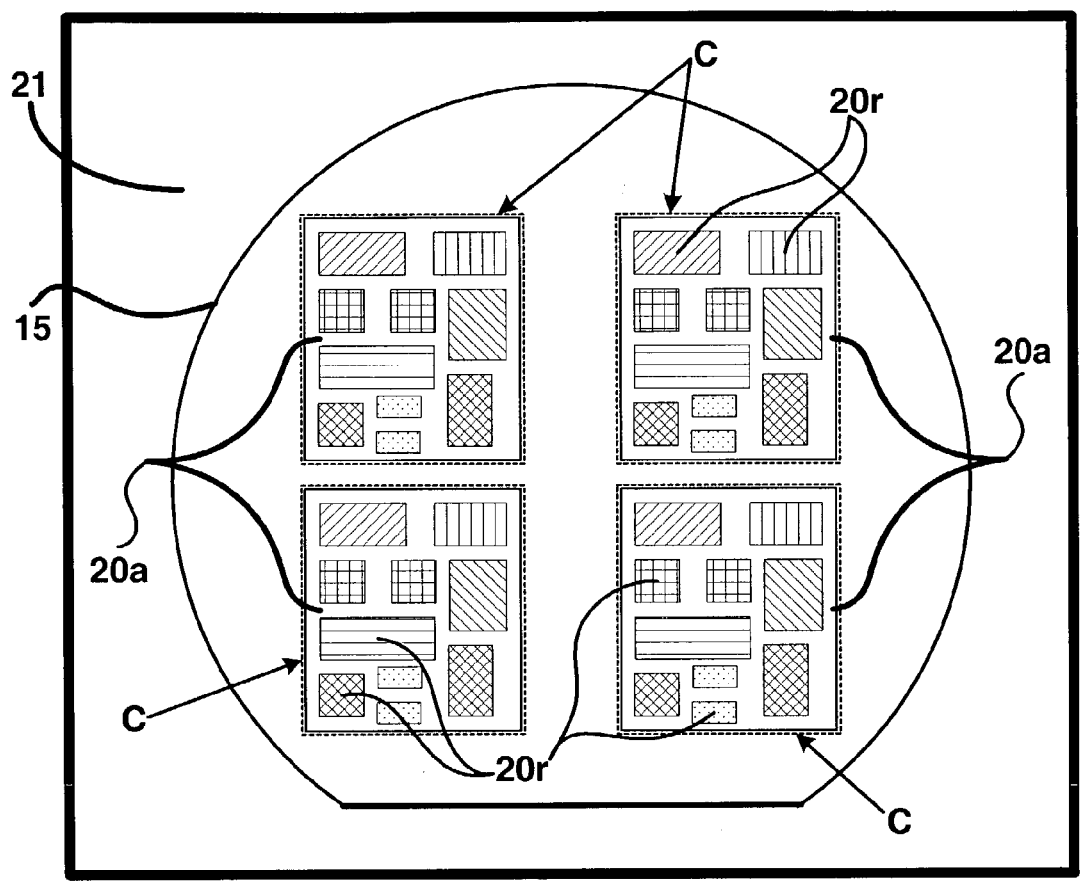
FIGS. 8 through 10 depict separating a silicon-based elastomer layer from a release layer to form an imprint stamp according to the present invention.
Figure 9:
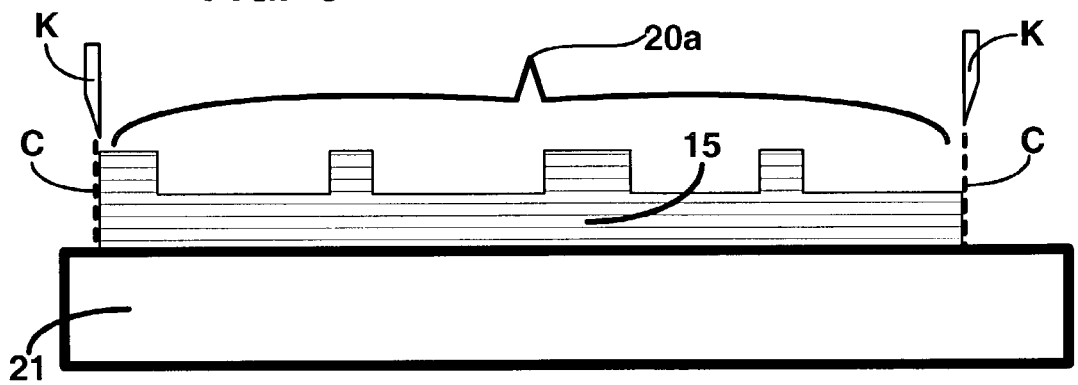
Figure 10:
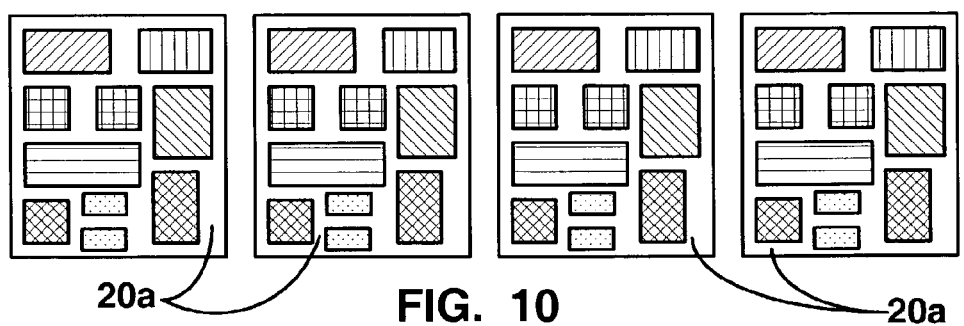

After the curing step, a complementary image of the imprint patterns 20p are replicated 20r in the silicone-based elastomer layer 15 such that an imprint stamp 20a is formed in the silicone-based elastomer layer 15 (see FIGS. 8 through 10).

In FIG. 7, after the curing step, the silicone-based elastomer layer 15 is released from the release layer 13. A tip of a pair of tweezers or an edge of a knife or razor, such as an X-Acto® Knife, can be used to separate the silicone-based elastomer layer 15 from the release layer 13 as depicted by a knife edge K and a dashed arrow inserted between the silicone-based elastomer layer 15 and the release layer 13. The silicone-based elastomer layer 15 can then be lifted off of the release layer 13 by grabbing an edge of the silicone-based elastomer layer 15 and peeling off (see dashed arrow P) the silicone-based elastomer layer 15 from the release layer 13. If the above mentioned cover layer 16 is used, then the cover layer 16 is removed from the silicone-based elastomer layer 15 before the silicone-based elastomer layer 15 is released from the release layer 13.

In FIGS. 8, 9, and 10, the imprint stamp 20a is removed from an excess portion of the silicone-based elastomer layer 15 that surrounds the imprint stamp 20a. If the above mentioned cover layer 16 is used, then the imprint stamp 20a is removed from an excess portion of the silicone-based elastomer layer 15 and the cover layer 16 that surround the imprint stamp 20a.

In either case, the imprint stamp 20a can be removed from the excess portion by placing the silicone-based elastomer layer 15 on a substantially flat substrate 21 and then cutting C around a perimeter (see dashed lines in FIGS. 8 and 9) of the imprint stamp 20a to release the excess portions of the silicone-based elastomer layer 15 or the silicone-based elastomer layer 15 and the cover layer 16 from the imprint stamp 20a. A knife, razor, die, or the like can be used to accomplish the cutting as depicted by a knife K in FIG. 9. After the imprint stamp 20a has been released, the excess portions (15, or 15 and 16) can be peeled off of the substantially flat substrate 21 so that the imprint stamp 20a is no longer connected with the excess portions (see FIG. 10). The substantially flat substrate 21 can be a material including but not limited to a glass, a metal, a plastic, and quartz. For example, the substantially flat substrate 21 can be a glass plate.

Optionally, the above mentioned steps may be repeated as necessary to produce additional imprint stamps 20a using the master substrate 11. One advantage of the method of the present invention is that the master substrate 11 is not damaged by the aforementioned process steps. Consequently, the same master substrate 11 can be repeatedly used to produce several imprint stamps 20a. Therefore, the cost of patterning and etching the master substrate 11 and depositing the release layer 13 can be amortized over several imprint stamps 20a.

Another advantage of the method of the present invention is that the master substrate 11 need not be cleaned after each use in order to remove contaminants, such as dust particles, because the silicone-based elastomer layer 15 flows around the particles and entrains them. Consequently, the master substrate 11 is self-cleaning because the particles are removed with the silicone-based elastomer layer 15.

Figure 11:
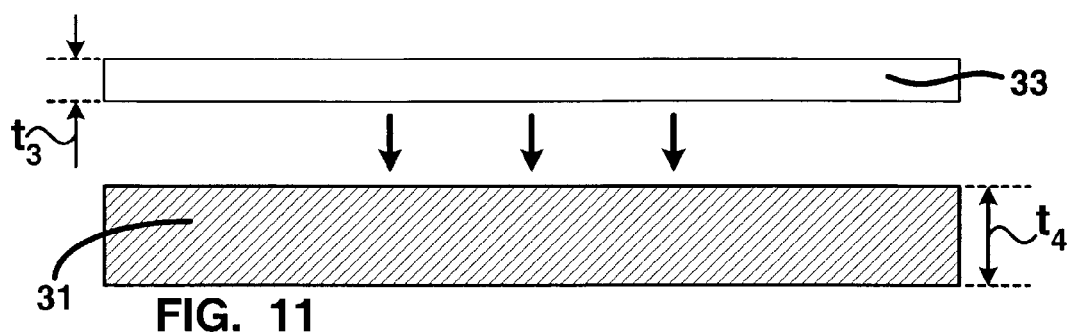
FIG. 11 depicts applying a thin plastic film to a silicone rubber backing according to the present invention.

In FIG. 11, a flat and thin plastic film 33 having a third thickness $t_3$ is placed on a flat and compliant silicone rubber backing 31 having a fourth thickness $t_4$. Suitable materials for the thin plastic film 33 include but are not limited to a Polymide and a Polyester (PET, Polyethylene Terephthalate). The third thickness $t_3$ and the fourth thickness $t_4$ will be application dependent. Preferably, the third thickness $t_3$ of the thin plastic film 33 is from about 40.0 µm to about 100.0 µm and the fourth thickness $t_4$ of the silicone rubber backing 31 is from about 0.125 inches to about 0.25 inches. The fourth thickness $t_4$ of the silicone rubber backing 31 should be selected to ensure the silicone rubber backing 31 is complaint (i.e. not stiff).

Figure 12:
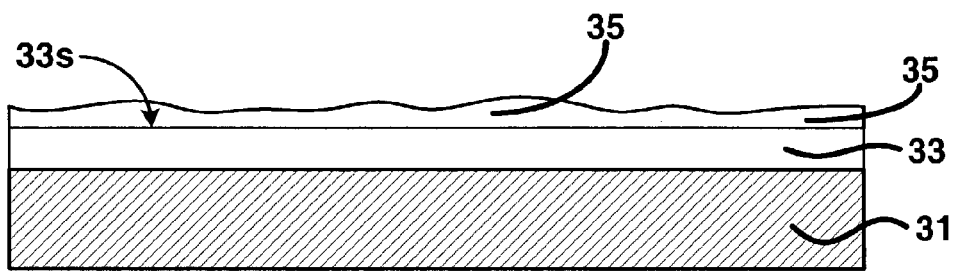
FIG. 12 depicts a coating of a thin plastic film with a photopolymer solution according to the present invention.

In FIG. 12, a surface 33s of the thin plastic film 33 is coated with a photopolymer solution 35. The photopolymer solution 35 can include but is not limited to a mixture of about 50% of a photopolymer material and about 50% acetone. As will be describe below, the acetone will evaporate leaving a substantially photopolymer layer on the surface 33s of the thin plastic film 33. The photopolymer material can include but is not limited to a Norland™ Optical Adhesive that cures when exposed to ultraviolet light. Preferably, the photopolymer material will cure in a time from about 5.0 seconds to about 60.0 seconds. For example, a Norland® NOA 83H photopolymer can be used for the photopolymer solution 35.

Figure 13:
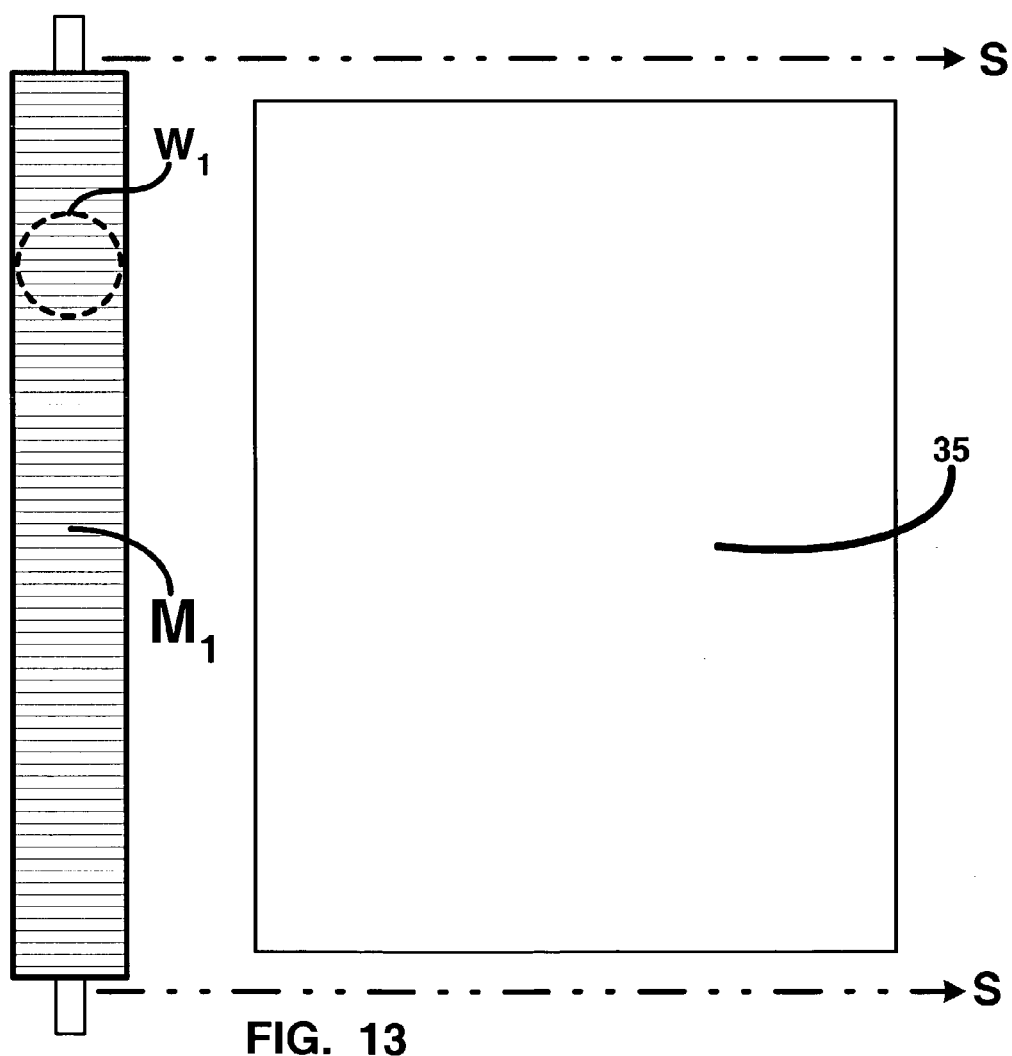
FIGS. 13 and 14 depict a spreading of a photopolymer solution to form a photopolymer layer over a thin plastic film according to the present invention.
Figure 14:
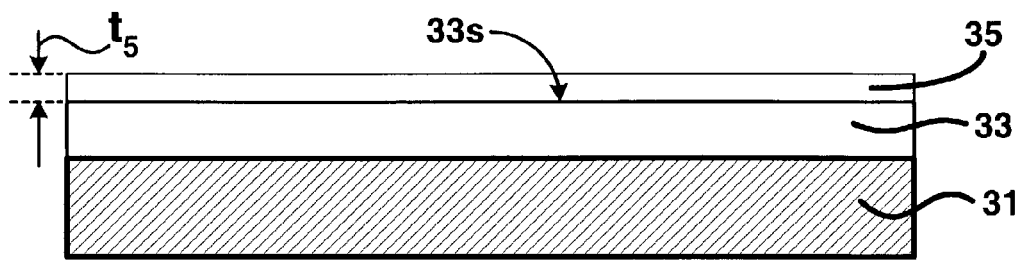

In FIGS. 13 and 14, the photopolymer solution 35 is spread over the surface 33s of the thin plastic film 33 to form a photopolymer layer 35 having a fifth thickness $t_5$. Preferably, the spreading of the photopolymer solution 35 is accomplished using a Mayer bar $M_1$ that is wound with a wire $W_1$ having a first diameter. The Mayer bar $M_1$ slides S over the surface 33s and meters the photopolymer solution 35 so that the photopolymer layer 35 having a fifth thickness $t_5$ is formed. Any acetone in the photopolymer solution 35 substantially evaporates during the spreading process. As a result, the photopolymer layer 35 comprises substantially a photopolymer material as described above. Preferably, the fifth thickness $t_5$ of the photopolymer layer 35 is from about 5.0 µm to about 10.0 µm. The first diameter of the wire $W_1$ will be application dependent. Preferably, the first diameter of the wire $W_1$ is from about 50.0 µm micrometers to about 100.0 µm.

Figure 15:
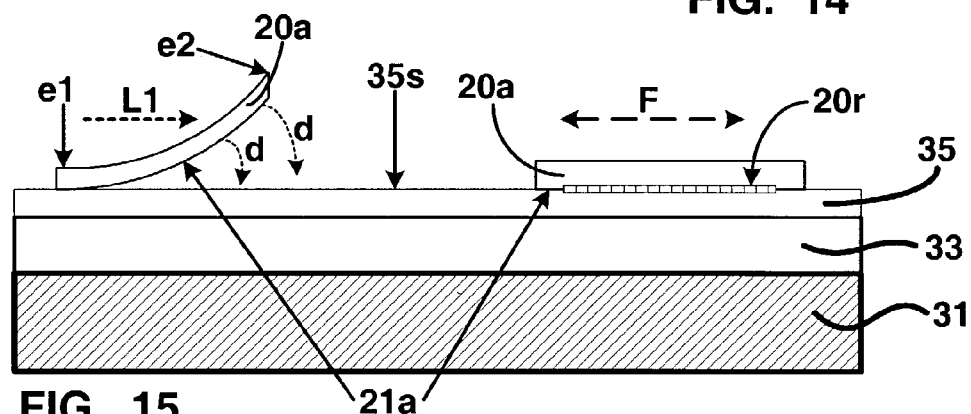
FIG. 15 depicts a placing of a patterned side of an imprint stamp on a photopolymer layer according to the present invention.

In FIG. 15, a patterned surface 21a of the imprint stamp 20a is placed on the photopolymer layer 35. Placing the imprint stamp 20a on the photopolymer layer 35 can include placing an edge e1 of the imprint stamp 20a in contact with the photopolymer layer 35 and holding the edge e1 down while progressively lowering see arrows L1 and d) a remainder of the patterned surface 21a into contact with the photopolymer layer 35. A pair of tweezers or a suction wand can be used to grasp an edge e2 to accomplish the lowering and to hold the edge e1 down. Alternatively, a rubber roller or the like can be used in conjunction with the progressive lowering to bring the patterned surface 21a into contact with the photopolymer layer 35.

One advantage to the progressive lowering is that air entrapped between the photopolymer layer 35 and the patterned surface 20r is displaced so that air bubbles that can cause defects are not trapped between the photopolymer layer 35 and the patterned surface 20r.

Another advantage of the method of the present invention is that once the imprint stamp 20a has been placed on the photopolymer layer 35, the imprint stamp 20a can be floated (see dashed arrow F) over a surface 35s of the photopolymer layer 35 to position the imprint stamp 20a at a predetermined location on the photopolymer layer 35. The floating F can be done manually using a tweezer or suction wand, or the floating F can be automated and a precision mechanical device, such as a robotic end effector, can be used to precisely position the imprint stamp 20a.

Figure 16:
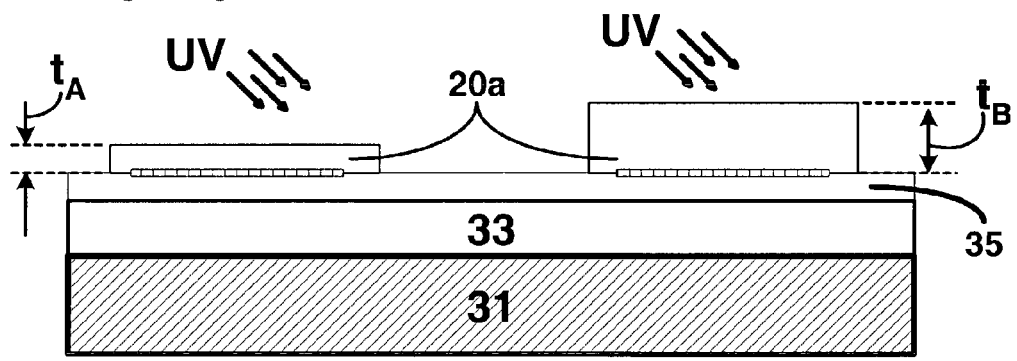
FIG. 16 depicts curing a photopolymer layer according to the present invention.

In FIG. 16, the photopolymer layer 35 is cured to fix a position of the imprint stamp 20a on the photopolymer layer 35 and to transfer an image of the imprint pattern 20r to the photopolymer layer 35. The photopolymer layer 35 is cured by irradiating the photopolymer layer 35 with an ultraviolet light UV of a predetermined intensity for a first time period. The photopolymer layer 35 hardens as it cures and an the image of the imprint pattern 20r that is transferred into the photopolymer layer 35 also hardens and is fixed in the photopolymer layer 35 as an imprint pattern 20s.

The ultraviolet light UV can have a wavelength that includes but is not limited a range from about 300.0 nm to about 400.0 nm. The predetermined intensity of the ultraviolet light UV can include but is not limited to an intensity of about 150 mW/cm$^2$. The first time period can include but is not limited to a time period from about 5.0 seconds to about 60.0 seconds. For example, the ultraviolet light UV can be from a UVA ultraviolet light source.

Yet another advantage of the method of the present invention is that the imprint stamps 20a that are used to pattern the photopolymer layer 35 can have a thickness (see $t_A$ and $t_B$ in FIG. 16) that can vary and those variations in thickness will not effect the accuracy of the transfer of the imprint pattern 20r to imprint pattern 20s of the photopolymer layer 35. The variations in thickness ($t_A$ and $t_B$) can be due to variations in the process used to make the imprint stamps 20a, variations in the first depth $d_1$ of FIG. 7, or the use of different master substrates 11 to make different imprint stamps 20 with different imprint patterns 20p.

Figure 17:
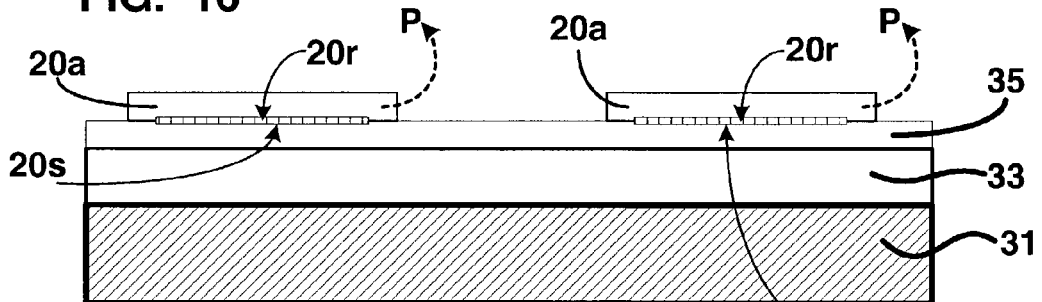
FIG. 17 depicts removing an imprint stamp from a photopolymer layer according to the present invention.
Figure 18:
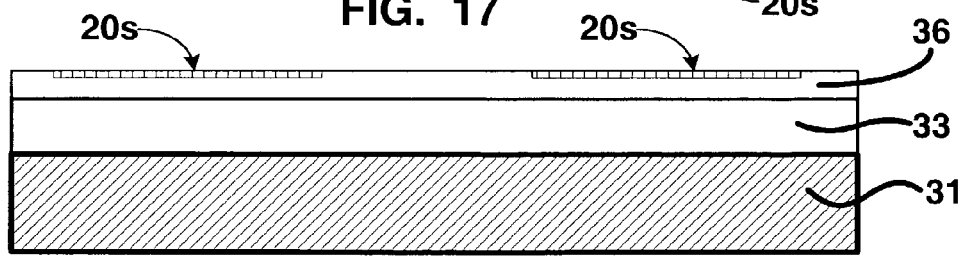
FIG. 18 depicts a photopolymer shim formed in a photopolymer layer according to the present invention.

After the curing step, in FIGS. 17 and 18, the imprint stamps 20a are removed P from the photopolymer layer 35 so that the image of the imprint pattern 20r defines a photopolymer shim 36 with the imprint pattern 20s fixed therein. The imprint stamps 20a can be removed P using a pair of tweezers or the like to grab an edge (e1 or e2) and then lift the imprint stamps 20a from the photopolymer layer 35 (see dashed arrow P).

Figure 19:
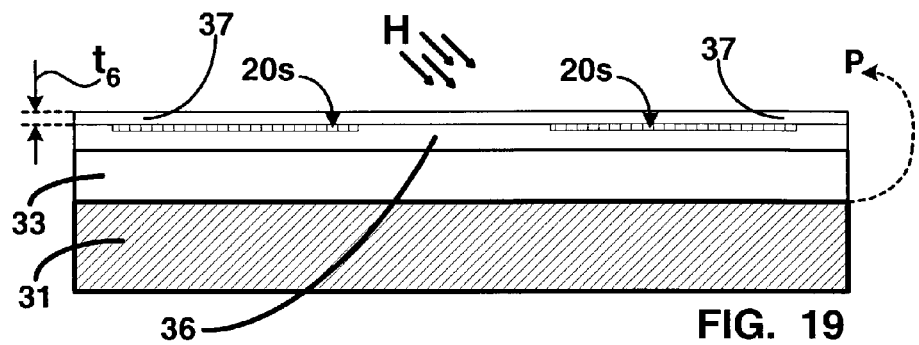
FIG. 19 depicts a fluorocarbon coating deposited on a photopolymer shim according to the present invention.

In FIG. 19, the photopolymer shim 36 is post-cured by heating the photopolymer shim 36. The post-curing of the photopolymer shim 36 can include but is not limited to a time of about 1.0 hour at a temperature of about 100° C. Optionally, afer the post-curing step, the photopolymer shim 36 can be rinsed with an acetone solution to remove chemical species which might inhibit curing of a silicone based elastomer material such as PDMS or the above mentioned SYLGARD® silicone-based elastomers. The post-curing of the photopolymer shim 36 drives off cure-inhibiting species and improves an adhesion of the photopolymer shim 36 to the thin plastic film 33.

In FIG. 19, after the post-curing of the photopolymer shim 36, a coating of a fluorocarbon material 37 having a sixth thickness $t_6$ is deposited on the photopolymer shim 36. The sixth thickness $t_6$ can include but is not limited to a thickness from about 50.0 nm to about 150.0 nm. As an example, the fluorocarbon material 37 can be deposited using a plasma deposition of a trifluoromethane ($CHF_3$) gas for about 5.0 minutes.

Also in FIG. 19, after the deposition of the fluorocarbon material 37, a tweezer or a knife edge can be inserted between the thin plastic film 33 and the silicone rubber backing 31 and the thin plastic film 33 can be pulled off of the silicone rubber backing 31 as shown by the dashed arrow P. Hereinafter, the combination of the photopolymer shim 36 and the thin plastic film 33 will be referred to as the photopolymer shim 36 unless otherwise noted.

Figure 20:
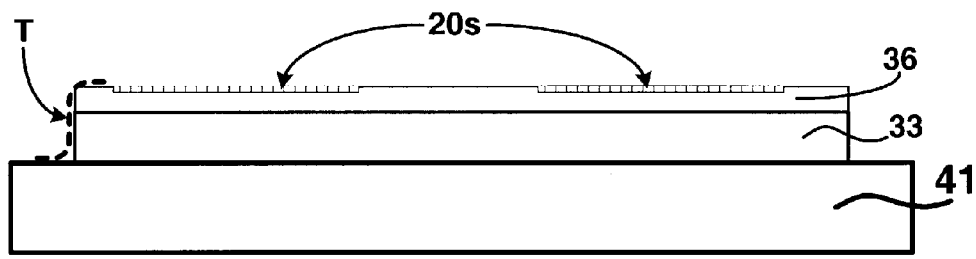
FIG. 20 depicts a photopolymer shim attached to a support substrate according to the present invention.

In FIG. 20, after the thin plastic film 33 is separated, the photopolymer shim 36 is attached to a support substrate 41. The photopolymer shim 36 can be connected with the support substrate 41 by laying the photopolymer shim 36 on the support substrate 41 and fastening an end of the photopolymer shim 36 to the support substrate 41 using an adhesive. For example, a high temperature adhesive tape T can be used. The support substrate 41 can be made from a material including but not limited to a glass and quartz.

Figure 21:
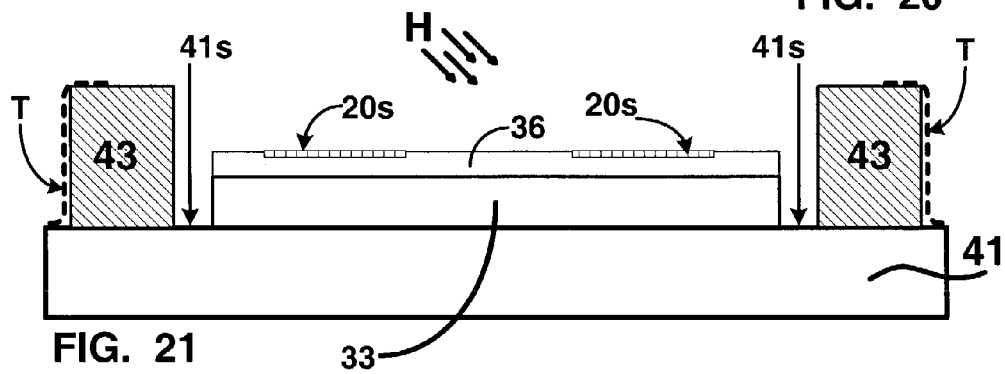
FIG. 21 depicts a shim stock attached to a support substrate and a pre-heating of the support substrate according to the present invention.
Figure 22:
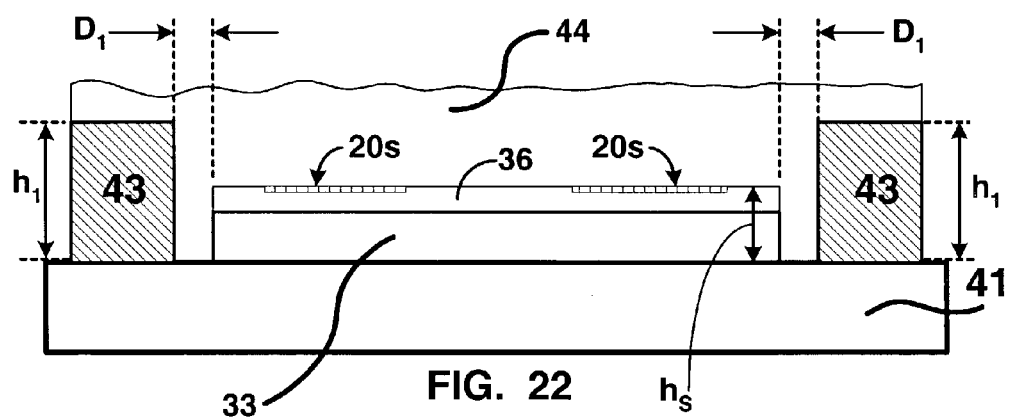
FIGS. 22 and 23 depict coating and spreading a silicone-based elastomer material over of a photopolymer shim and a shim stock according to the present invention.

In FIGS. 21 and 22, a shim stock 43 having a first height $h_1$ is attached to the support substrate 41. The shim stock 43 can be connected with the support substrate 41 using an adhesive such as the above mentioned high temperature adhesive tape T, for example. The shim stock 43 is positioned adjacent to the photopolymer shim 36 and is spaced apart from the photopolymer shim 36 by a first distance $D_1$ so that there is a space between the shim stock 43 and the photopolymer shim 36 on a surface 41s of the support substrate 41. The first height $h_1$ of the shim stock 43 should exceed a height $h_S$ of the photopolymer shim 36 as depicted in FIG. 22. The first height $h_1$ and the first distance $D_1$ will be application dependent; however, the first height $h_1$ can be in a range including but not limited to from about 0.5 mm to about 1.5 mm and the first distance $D_1$ can be in a range including but not limited to from about 1.0 mm to about 2.0 mm. The shim stock 43 can be a material including but not limited to a metal, a glass, quartz, and stainless steel. For instance, the shim stock 43 can be a stainless steel shim stock and the first height $h_1$ can be about 0.5 mm.

In FIG. 21, the support substrate 41 is preheated H to increase a temperature of the support substrate 41 in preparation for a coating of the shim stock 43 and the photopolymer shim 36 with a silicone-based elastomer material as will be discussed below. Preferably, the silicone-based elastomer material is not coated on a cold or on a room temperature (i.e. from about 18.0° C. to about 28.0° C.) support substrate 41. The preheated temperature for the support substrate 41 will be application dependent and the temperature should not exceed a temperature limit of the photopolymer shim 36. For example, the support substrate 41 can be preheated to a temperature of about 100° C. A temperature of about 100° C. is below the temperature limits of most photopolymer materials.

Figure 23:
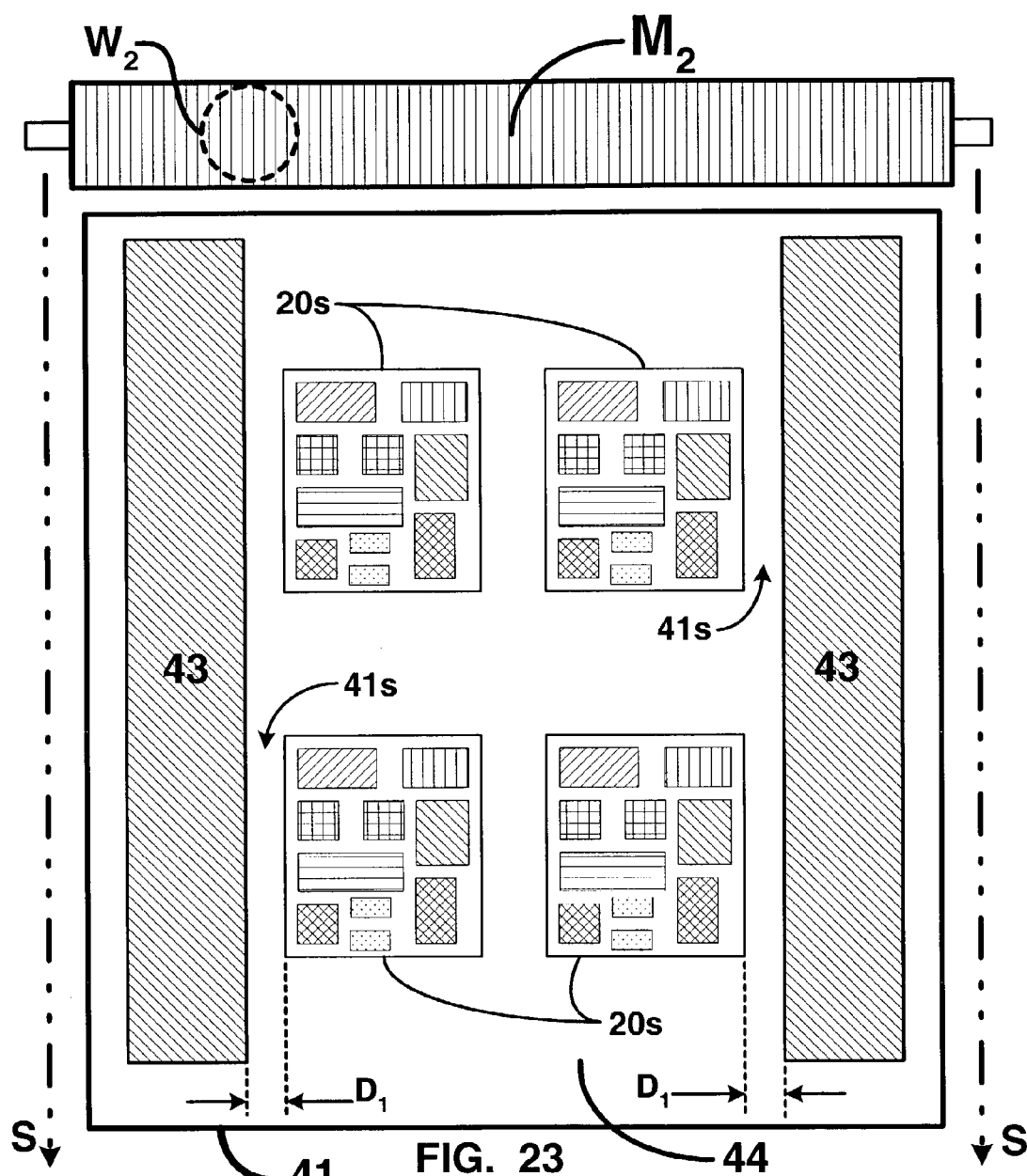

In FIGS. 22 and 23, the photopolymer shim 36 and the shim stock 43 are coated with a compliant material 44 that completely covers the photopolymer shim 36 and the shim stock 43 (see FIG. 22). Suitable materials for the compliant material 44 include but are not limited to a silicone-based elastomer material and an amorphous fluoropolymer material.

Suitable silicone-based elastomer materials include but are not limited to Polydimethyl Siloxane (PDMS), DOW CORNING® silicone-based conformal coatings including SYLGARD® 182 silicone elastomer, SYLGARD® 183 silicone elastomer, SYLGARD® 184 silicone elastomer, and SYLGARD® 186 silicone elastomer. Preferably, the PDMS is a mixture of about 10.0 parts of a base and about 1.5 parts of a curing agent. The base and the curing agent can be mixed by weight or by volume as they have the same density.

A suitable material for the amorphous fluoropolymer material includes but is not limited to TEFLON® AF. For example, a DuPont™ TEFLON® AF can be used for the compliant material 44. When the compliant material 44 comprises the amorphous fluoropolymer material, the above mentioned preheating step of FIG. 21 is not required.

Figure 24:
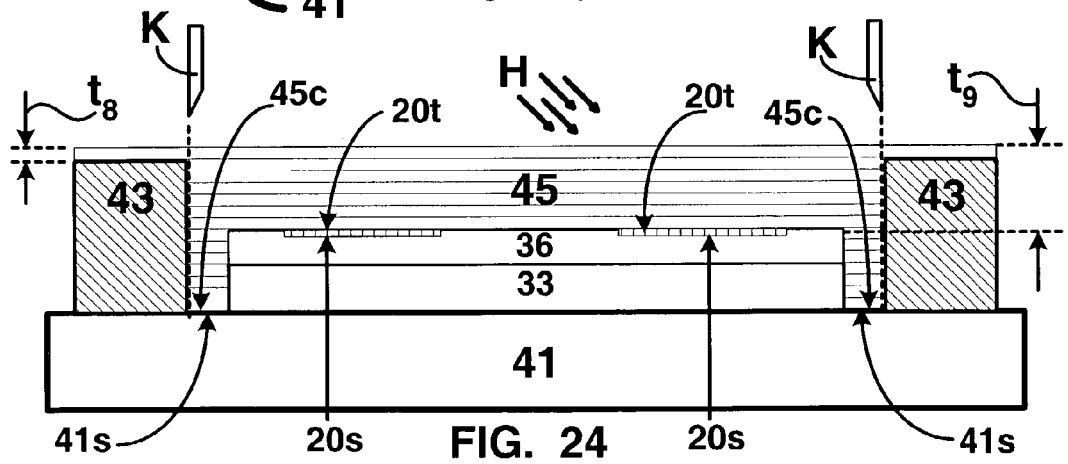
FIG. 24 depicts a heating of a support substrate according to the present invention.

In FIGS. 23 and 24, the compliant material 44 is spread over the photopolymer shim 36 and the shim stock 43 to form a compliant media 45 that covers the photopolymer shim 36 and the shim stock 43 (see thicknesses $t_8$ and $t_9$ in FIG. 24). The imprint pattern 20s in the photopolymer shim 36 is transferred to the compliant media 45 so that an imprint stamp 20t is formed in the compliant media 45.

Preferably, the spreading of the compliant material 44 is accomplished using a Mayer bar $M_2$ that is wound with a wire $W_2$ having a second diameter. The Mayer bar $M_2$ slides S over the shim stock 43 and meters the compliant material 44 to form a smooth and uniformly thick compliant media 45. The compliant material 44 will cover the shim stock 43 by a thickness $t_8$ and will cover the photopolymer shim 36 by a thickness $t_9$, where $t_9 \gg t_8$. The Mayer bar $M_2$ is wound with a much coarser diameter of wire than the Mayer bar $M_1$ that was discussed above. The second diameter of the wire $W_2$ will be application dependent. Preferably, the second diameter of the wire $W_2$ is from about 1.0 mm to about 3.0 mm. For example, a wire with a diameter of about 1.5 mm can be wound on the Mayer bar $M_2$.

After the spreading, the support substrate 41 is heated H. The surface 41s is operative to provide a surface for a portion 45c of the compliant media 45 to adhere to during and after the heating step. The time and temperature for the heating H of the substrate 41 will be application dependent, and as before, the temperature must not exceed a temperature limit for the photopolymer shim 36 or for the compliant media 45. As an example, the support substrate 41 can be heated H for about 4.0 hours at a temperature of about 100.0° C. when the compliant media 45 is made from the silicone-based elastomer material. The heating H cures the silicone-based elastomer material. Alternatively, the support substrate 41 can be heated H for about 4.0 hours at a temperature of about 60.0° C. when the compliant media is made from the amorphous fluoropolymer material. In this case, the heating H drys out the amorphous fluoropolymer material.

After the heating step, the support substrate 41 is cooled down. Preferably, the support substrate 41 is allowed to cool down to a temperature of about a room temperature (i.e. from about 18.0° C. to about 28.0° C.).

After the support substrate 41 has cooled down, the shim stock 43 is removed from the support substrate 41. In FIG. 24, the shim stock 43 can be removed by cutting K the compliant media 45 along an edge of the shim stock 43 that is adjacent to the photopolymer shim 36. A knife, razor, or the like can be used to cut K the compliant media 45. After the compliant media 45 is cut K, the shim stock 43 can be pulled off of the support substrate 41. The edge of the shim stock 43 (see dashed line for K) should be used as a guide for making the cut K because the portion 45c of the compliant media 45 adheres to the surface 41s of the support substrate 41 and the adhesion prevents the compliant media 45 from being prematurely separated from the substrate 41.

Figure 25:
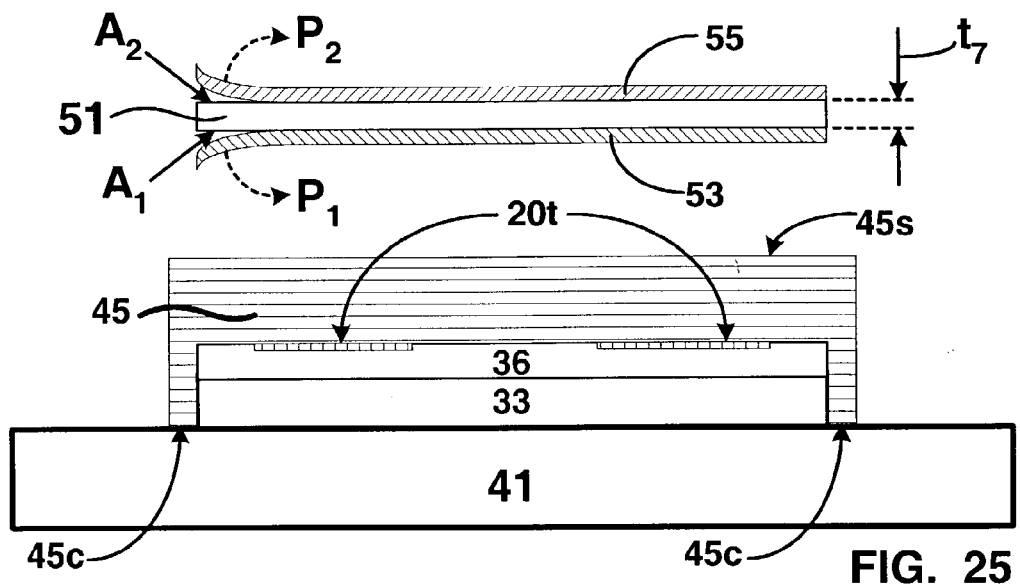
FIGS. 25 through 27 depict applying a transfer adhesive to a compliant media according to the present invention.
Figure 26:
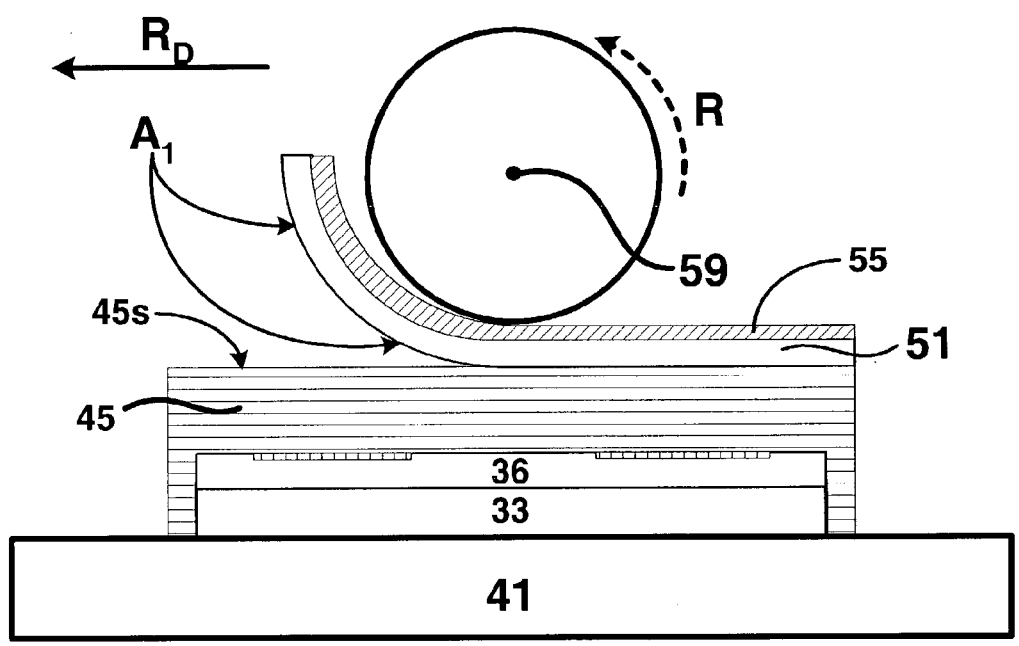
Figure 27:
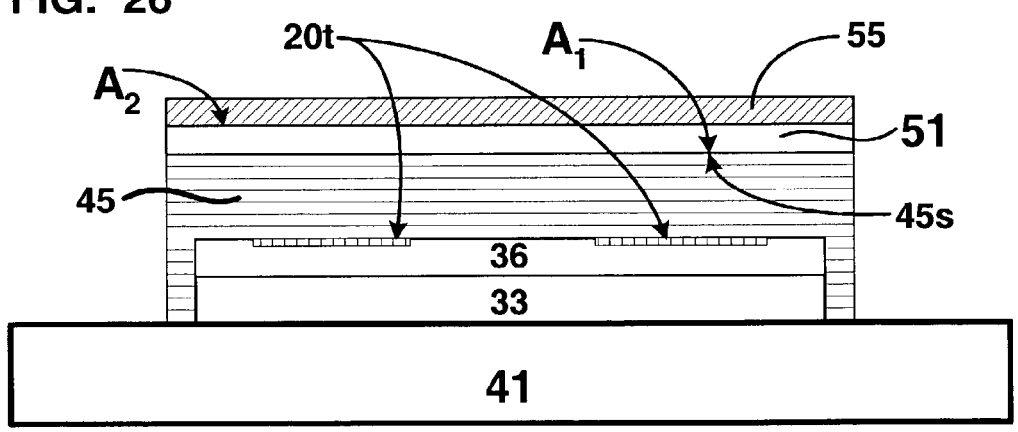

In FIGS. 25 through 27, a first adhesive surface $A_1$ of a transfer adhesive layer 51 is applied to a surface 45s of the compliant media 45 so that the transfer adhesive layer 51 adheres to the compliant media 45. The transfer adhesive layer 51 includes a seventh thickness $t_7$ and a second adhesive surface $A_2$ as will be described below.

In FIG. 25, the first adhesive surface $A_1$ can be exposed, prior to being applied to the surface 45s, by peeling back $P_1$ a first backing 53 from the transfer adhesive layer 51.

Similarly, the second adhesive surface $A_2$ can be exposed by peeling back $P_2$ a second backing 55 from the transfer adhesive layer 51. The first adhesive surface $A_1$ can be connected with the surface 45s by using a roller 59 (see FIG. 26).

In FIG. 26, the first adhesive surface $A_1$ is positioned at an edge of the compliant media 45 and then the roller 59 is rolled R across the second backing 55 to progressively apply the first adhesive surface $A_1$ across the surface 45s until the entire surface 45s is connected with the first adhesive surface $A_1$ (see FIG. 27). The roller 59 can be a rubber roller, for example. The roller 59 allows the first adhesive surface $A_1$ to be applied to the surface 45s without trapping air between the first adhesive surface $A_1$ and the surface 45s.

The seventh thickness $t_7$ of the transfer adhesive layer 51 will be application dependent. However, because the transfer adhesive layer 51 will remain attached to the compliant media 45 and because it is desirable for the compliant media 45 to be flexible, the transfer adhesive layer 51 should be as thin as possible. Preferably, the seventh thickness $t_7$ of the transfer adhesive layer 51 is from about 20.0 μm thick to about 100.0 μm thick.

Preferably, the transfer adhesive layer 51 is an optically transparent material so that another photopolymer material that is brought into contact with the compliant media 45 and the imprint stamp 20t can be cured by a light source that is incident on both the transfer adhesive layer 51 and the compliant media 45 as will be described below.

A suitable optically transparent material for the transfer adhesive layer 51 includes but is not limited to an Adhesives Research, Inc.™ ARclear™ DEV-8932 optically clear silicone adhesive. For instance, a 25.0 μm thick sheet (i.e the seventh thickness $t_7$=25.0 μm) of ARclear™ DEV-8932 can be used for the transfer adhesive layer 51.

Figure 28:
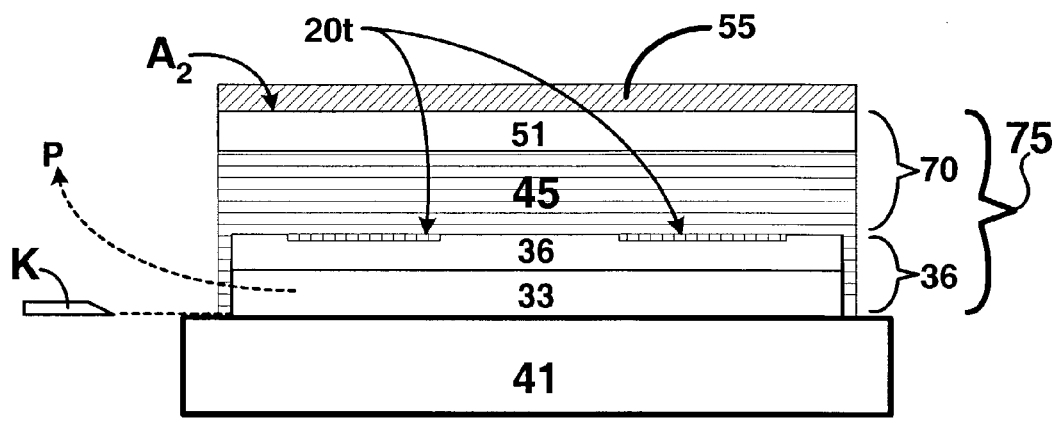
FIG. 28 depicts separating a compliant media from a support substrate according to the present invention.
Figure 29:
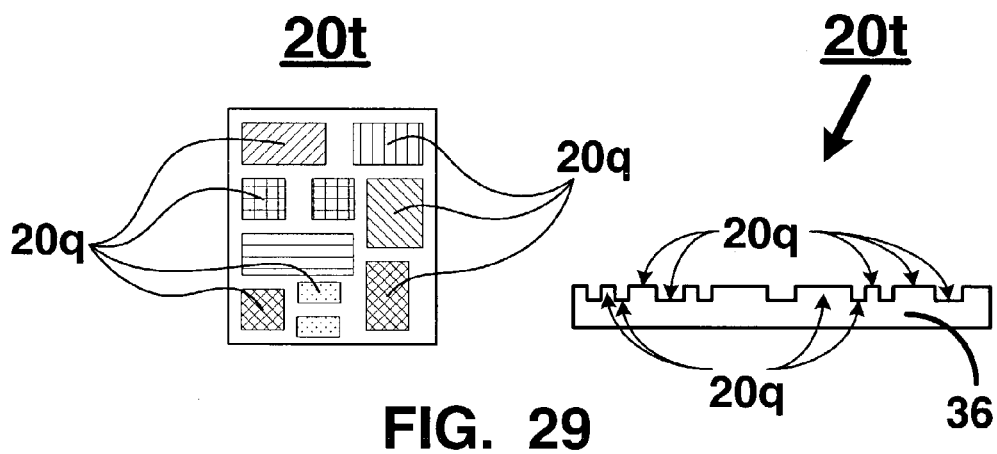
FIG. 29 is a top plan view and a cross-sectional view of an imprint pattern carried by a photopolymer shim according to the present invention.
Figure 30:
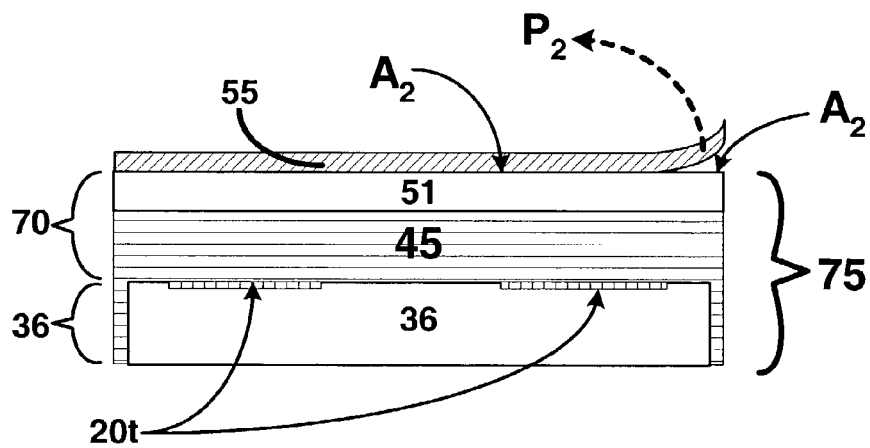
FIG. 30 depicts a compliant assembly according to the present invention.

In FIG. 28, the compliant media 45 can be separated from the support substrate 41 by using a knife, razor, suction wand, tweezer, or the like to initiate the separation of the compliant media 45 from the support substrate 41 as depicted by the knife K. In FIG. 29, an example of the features (i.e. patterns) that comprise the imprint stamp 20t are depicted in greater detail. In FIG. 30, after the peeling, the compliant media 45 is still connected with the photopolymer shim 36 and the thin plastic film 33.

An additional advantage of the method of the present invention is that the photopolymer shim 36 and the thin plastic film 33 layer protect the imprint stamp 20t from damage during subsequent processing and handling steps that will be described below in reference to FIGS. 31 through 37b. Those processing and handling steps can be completed and then the photopolymer shim 36 and the thin plastic film 33 layers can be peeled off to expose the imprint stamp 20t. Because the photopolymer shim 36 and the thin plastic film 33 layers will eventually be separated from the compliant media 45 in order to expose the imprint stamp 20t carried by the compliant media 45, hereinafter, unless otherwise noted, the combination of the layers comprising the photopolymer shim 36 and the thin plastic film 33 will be denoted as the photopolymer shim 36 (see FIG. 30).

Similarly, because the transfer adhesive layer 51 will remain connected with the compliant media 45, the combination of the compliant media 45 and the transfer adhesive layer 51 will be denoted as a compliant media 70. In FIGS. 28 and 30, the combination of the compliant media 70 and the photopolymer shim 36 will be denoted as a compliant assembly 75. As will be described below, the compliant assembly 75 will be connected with a cylinder and a flexible belt material.

Figure 31A:
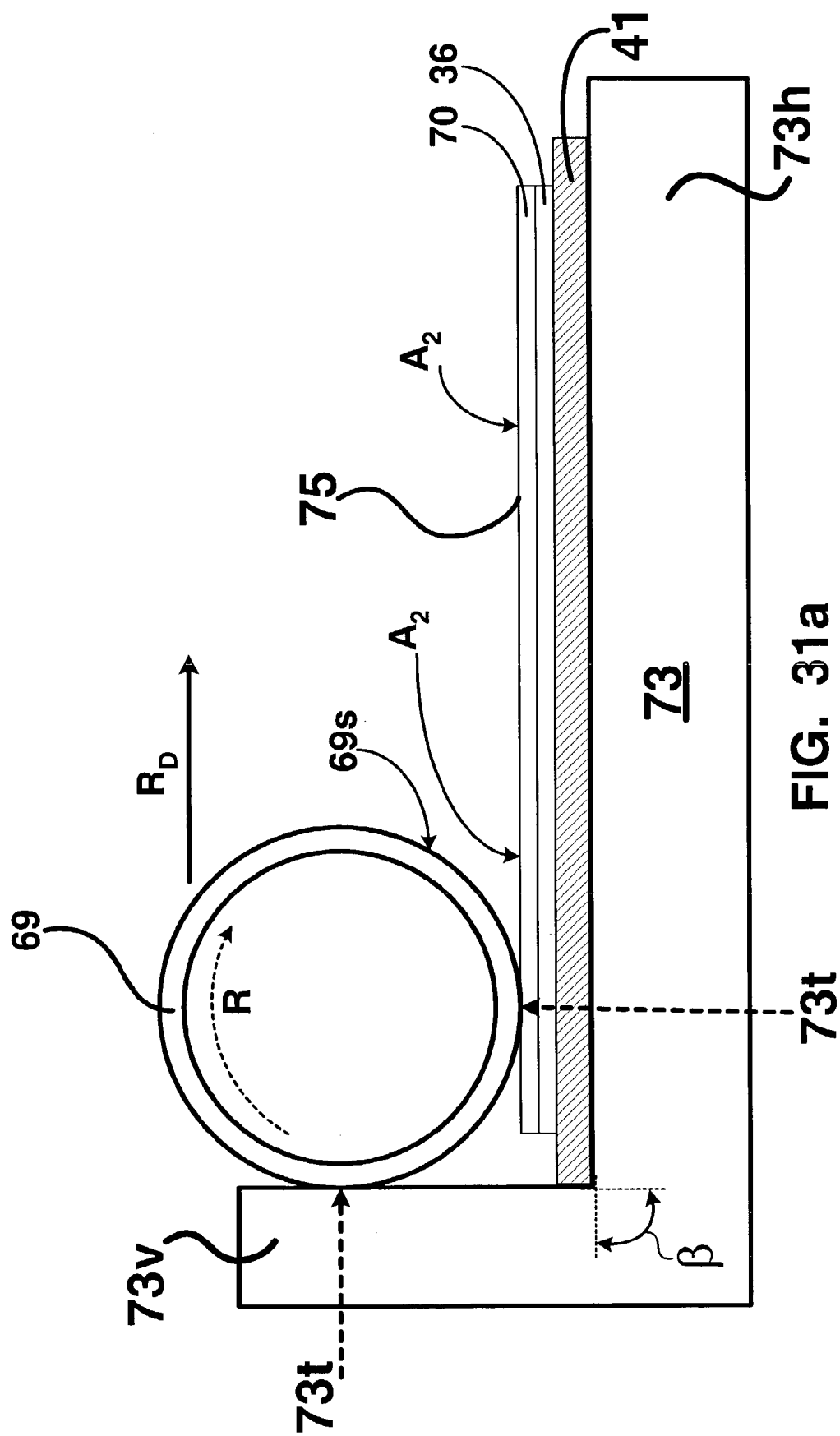
FIGS. 31a through 34b depict attaching a compliant assembly to a cylinder according to the present invention.
Figure 31B:
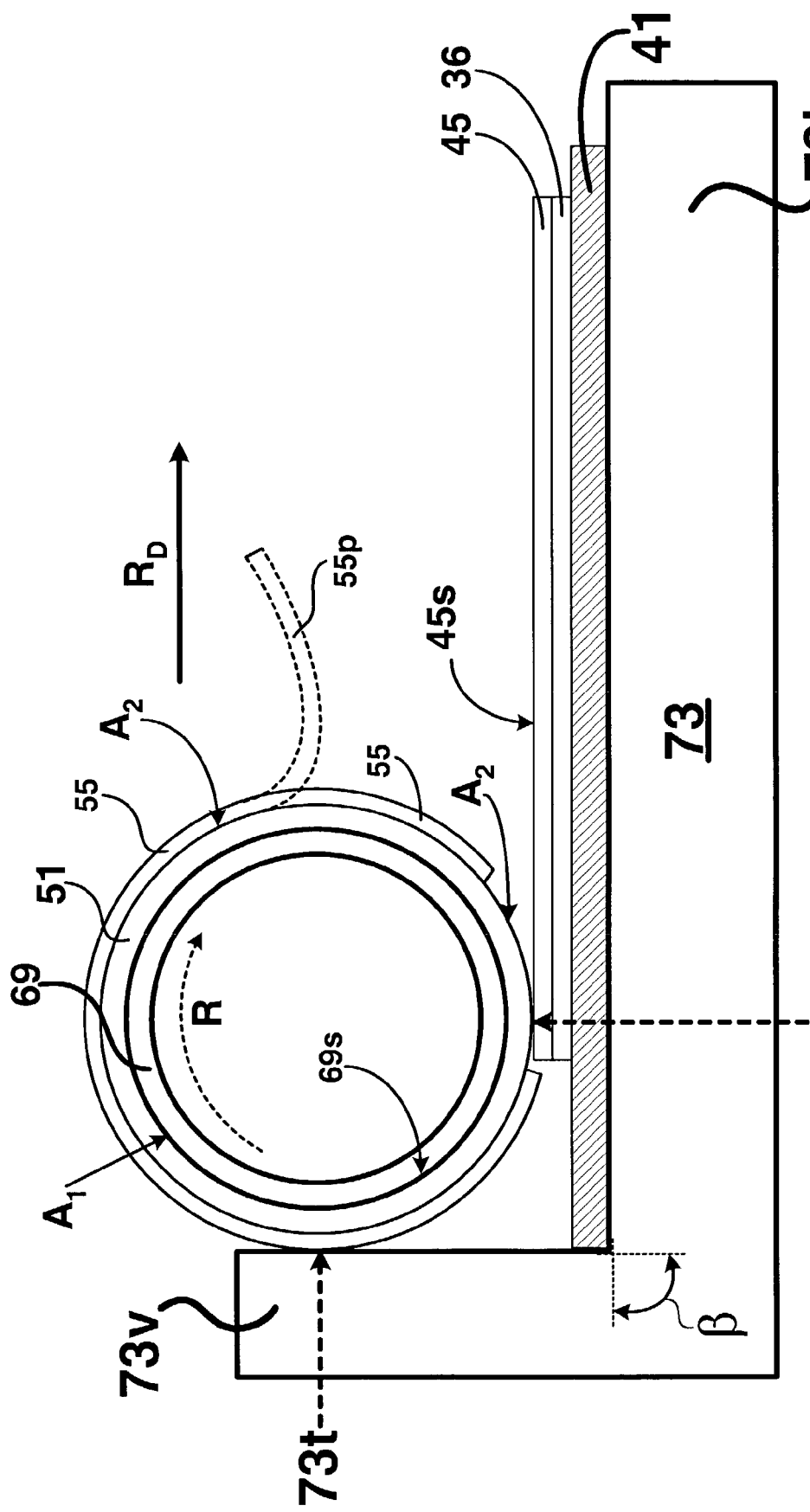
Figure 31C:
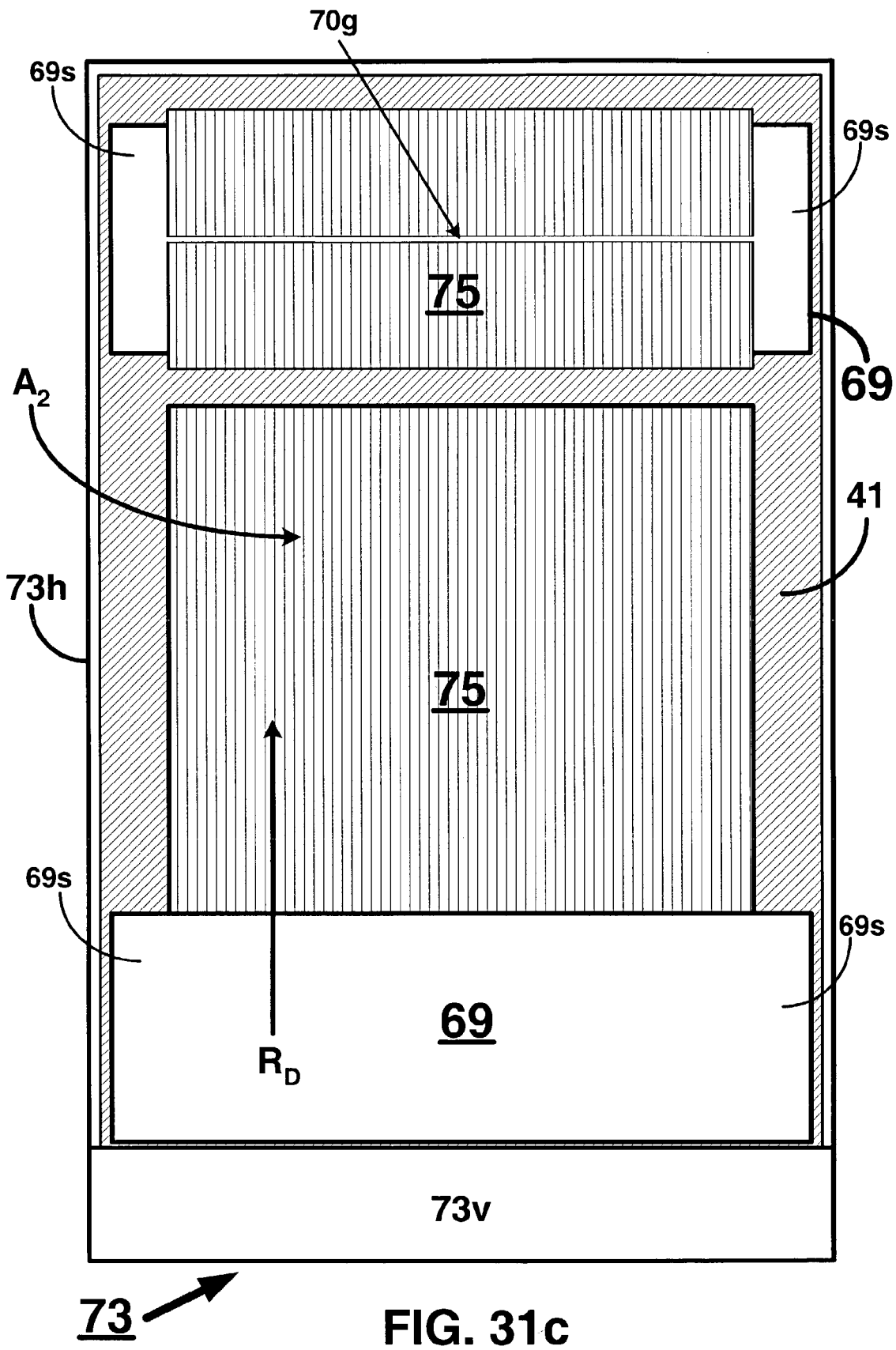

In FIGS. 31a, 31b, and 31c an L-shaped jig 73 that includes a horizontal section 73h and a vertical section 73v that forms a low vertical wall. The horizontal and vertical sections (73h, 73v) are at a right angle β to each other. The sections (73h, 73v) should be smooth and substantially flat. The L-shaped jig 73 can be used to effectuate a laminating of the compliant assembly 75 to a surface 69s of a cylinder 69.

In FIGS. 31a and 31b, the support substrate 41 can be placed on the horizontal section 73h and abutted against the vertical section 73v. Alternatively, if the compliant assembly 75 has already been separated from the support substrate 41, then a bed made from a smooth and flat piece of silicone rubber (not shown) can placed on the horizontal section 73h and an end of the bed is abutted against the vertical section 73v. The compliant assembly 75 is placed on top of the bed and is aligned with the vertical section 73v by using the vertical section 73v as a vertical straight edge. If the second backing 55 is still on the transfer adhesive layer 51, then the second backing 55 can be peeled off $P_2$ to expose the second adhesive surface $A_2$.

In FIGS. 31a and 31c, a cylinder 69 having an outer surface 69s is aligned with the horizontal section 73h and the vertical section 73v so that the outer surface 69s is tangent 73t to those sections (73h, 73v). The cylinder 69 is lowered onto the compliant assembly 75 so that the second adhesive surface $A_2$ is in contact with a portion of the outer surface 69s at the tangent point 73t. The cylinder 69 is then rolled R in a roll direction $R_D$ to collect the compliant assembly 75 on the outer surface 69s as the cylinder 69 is rolled R. After the compliant assembly 75 is rolled onto the cylinder 69, there may be a gap 70g between adjacent ends of the compliant assembly 75 as depicted in FIG. 31b.

Figure 32:
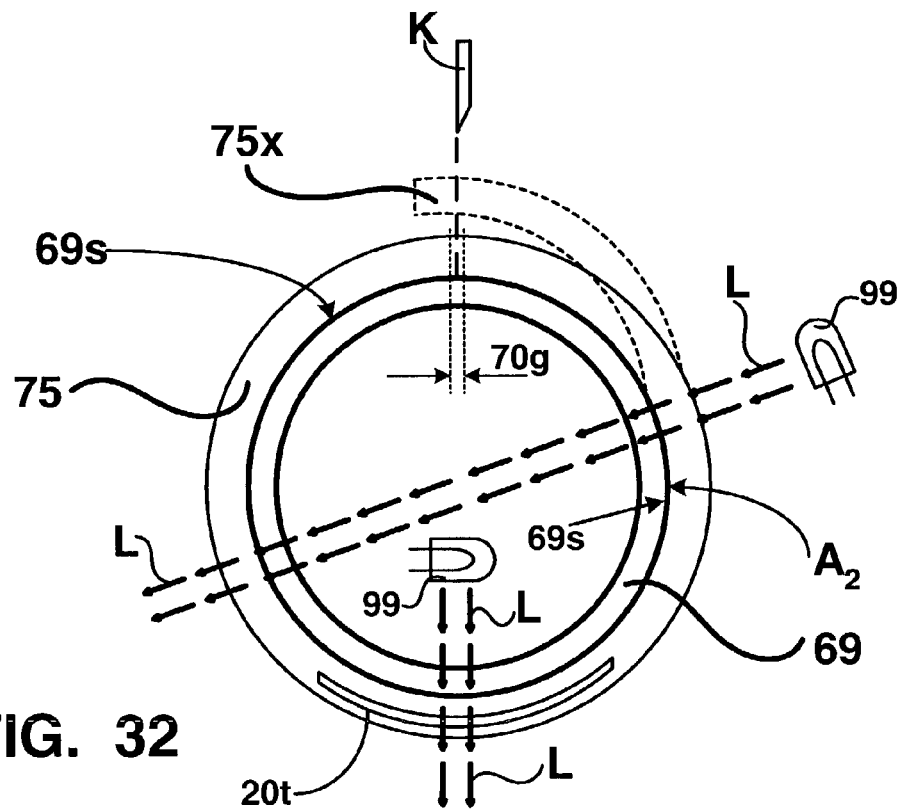

Suitable materials for the cylinder 69 include but are not limited to metal, ceramic, glass, quartz, and plastic. Preferably, the cylinder 69 is made from an optically transparent material so that light L can pass though the cylinder 69, the compliant media 70, and the imprint stamp 20t. Suitable optically transparent materials for the cylinder 69 include but are not limited to glass, quartz, and plastic. In FIG. 32, a light source 99, such as an ultraviolet light source, can be positioned inside or outside of the cylinder 69 to irradiate and cure a photopolymer material (not shown) that is urged into contact with the imprint stamp 20t. Because the compliant media 70 can be made to any size, the cylinder 69 can include an inside diameter that is sufficient to accommodate the light source 99. On the other hand, the light source 99 can be small enough to fit within an inside diameter of the cylinder 69.

In FIG. 31b, an alternative method for attaching the compliant media 45 to the cylinder 69 is depicted. The compliant media is denoted as 45 instead of 70 because the transfer adhesive layer 51 is not connected with the compliant media 45 in FIG. 31b. First, the first adhesive surface $A_1$ of the transfer adhesive layer 51 is exposed by peeling back the first backing 53 (not shown). Second, the outer surface 69s of the cylinder 69 is connected with the first adhesive surface $A_1$ and then the cylinder 69 is rolled to collect the transfer adhesive layer 51 on the outer surface 69s. Third, a portion of the second backing 55 is peeled back to expose a portion of the second adhesive surface $A_2$. Next, the exposed portion of the second adhesive surface $A_2$ is connected with the compliant media 45 at the tangent point 73t and the cylinder 69 is rolled in the roll direction $R_D$ to collect the compliant media 45 on the cylinder 69 while simultaneously peeling back 55p a remainder of the second backing 55 to expose the remainder of the second adhesive surface $A_2$.

Figure 33:
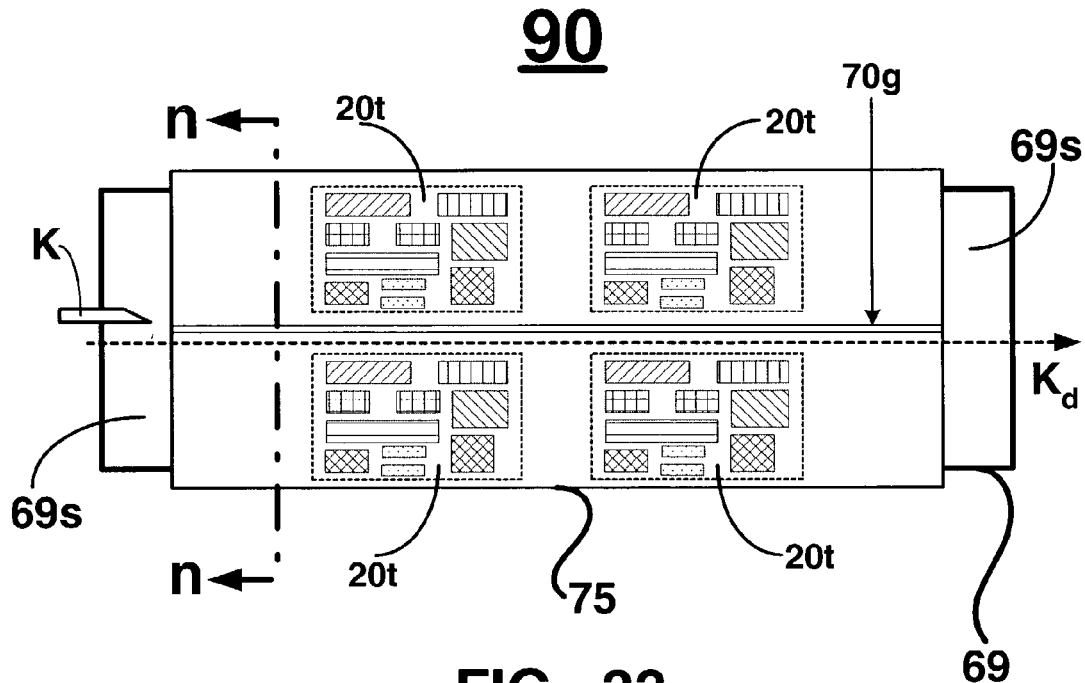

In FIGS. 32 and 33, after the compliant assembly 75 has been rolled onto the cylinder 69, there may be an excess portion 75x of the compliant assembly 75 that must be trimmed so that a majority of the compliant assembly 75 can be smoothly rolled onto the cylinder 69. As described above, there may be a gap 70g, if there is, then it is desirable to trim the excess portion 75x so that the gap 70g is as small as is practicable. A knife K or the like can be used to trim the excess 75x so that the compliant assembly 75 lays on the outer surface 69s without any bulges. In FIG. 33, the knife K can cut along a direction $K_d$ to effectuate the trimming of the excess 75x to form a completely laminated cylinder 90. In FIG. 33, the imprint stamps 20t are depicted in dashed outline because they are still positioned below the photopolymer shim 36 which have not been separated from the compliant media 70.

Figure 34A:
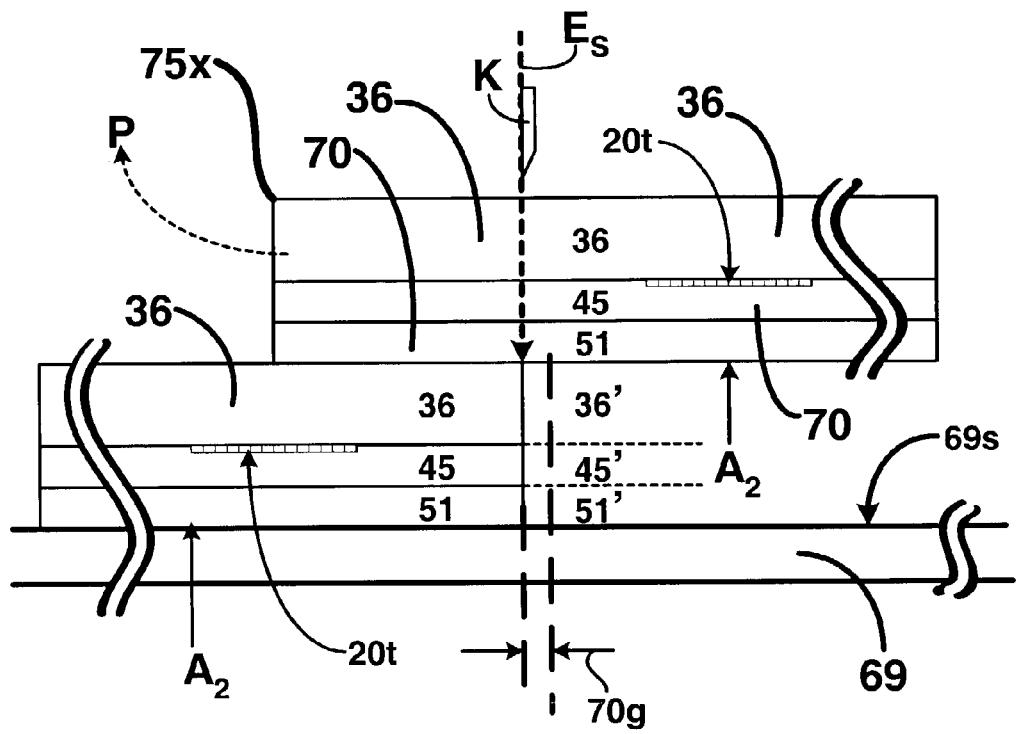
Figure 34B:
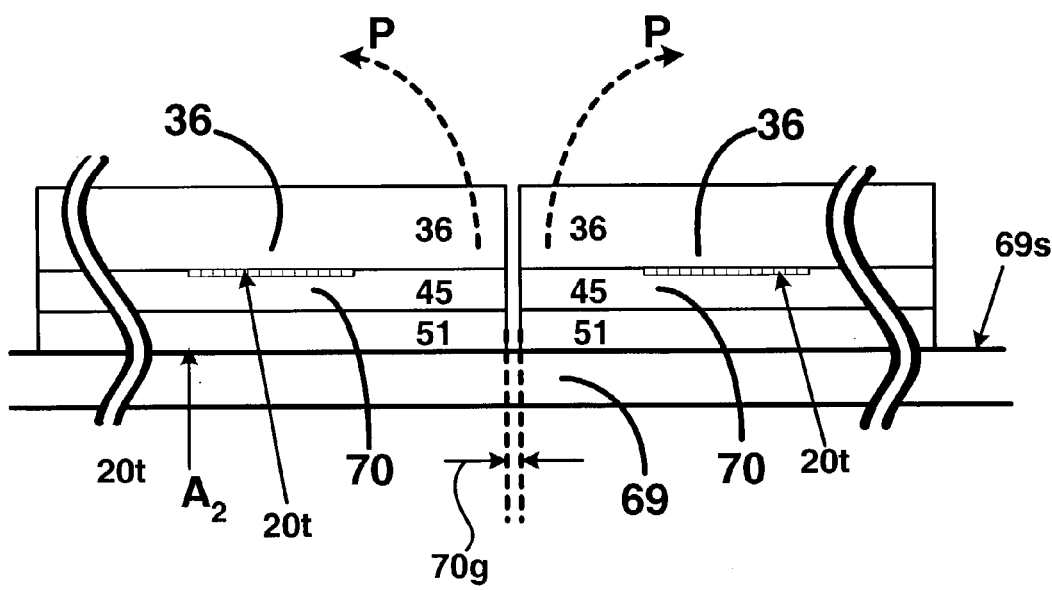

In FIG. 33, a line n—n thorough the cylinder 69 and the compliant assembly 75 is depicted in greater detail in a cross-sectional view in FIGS. 34a and 34b. In FIG. 34a, the compliant assembly 75 is depicted before the excess 75x is trimmed. In FIG. 34b, the compliant assembly 75 is depicted after the excess 75x has been trimmed.

In FIG. 34a, the excess portion 75x comprises the compliant media 70 and the photopolymer shim 36. Because the thin plastic film 33 (see FIG. 28) that is connected with the photopolymer shim 36 may be opaque to light and the photopolymer shim 36 can be optically transparent, the photopolymer shim 36 can be peeled back as denoted by the dashed arrow P so that the compliant media 70 (i.e. the optically transparent adhesive 51 and optically transparent compliant media 45) can be used to sight along an edge $E_S$ of the compliant assembly 75 that is already connected with the outer surface 69s of the cylinder 69.

A knife cut K along the sight line (see dashed line) for the edge $E_S$ can be used to trim off the excess 75x so that the unconnected layers of the excess 75x will align with their respective connected layers, that is: 36' to 36; 45' to 45; and 51' to 51, as depicted in FIG. 34a. After the trimming, there may be the small gap 70g between adjacent ends of the compliant assembly 75.

In FIG. 34b, but for the gap 70g, the compliant assembly 75 forms an almost continuous layer on the outer surface 69s of the cylinder 69. After the trimming, the photopolymer shim 36 can be peeled back P to expose the imprint stamp 20t on the compliant media 70.

Figure 35:
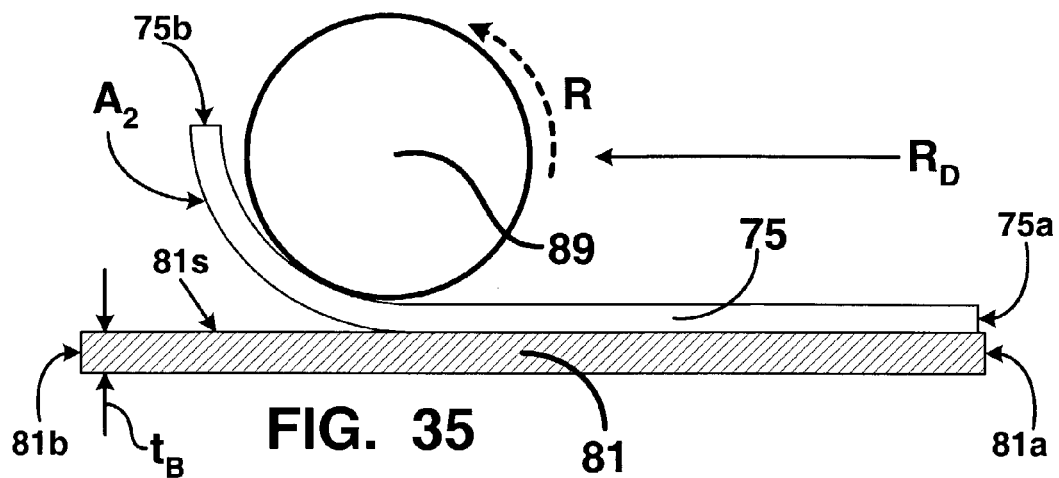
FIGS. 35 through 37b depict attaching a compliant assembly to a belt material according to the present invention.
Figure 36:
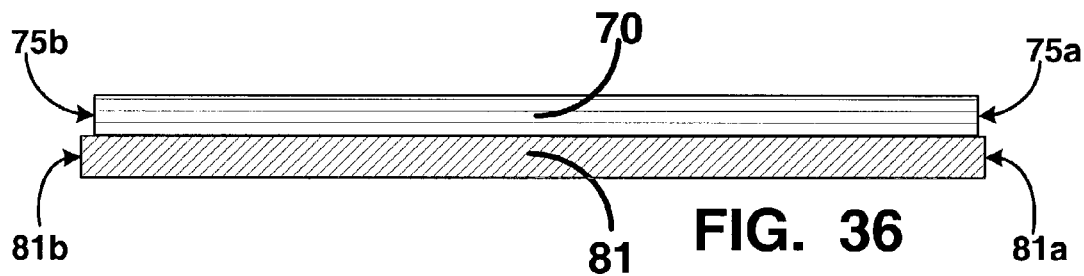

In FIGS. 35 and 36, the compliant assembly 75 is applied to a belt material 81. Prior to applying the compliant assembly 75 to the belt material 81, the second backing 55 is peeled off of the transfer adhesive layer 51 to expose the second adhesive surface $A_2$. Then the second adhesive surface $A_2$ is progressively applied to a surface 81s of the belt material 81. A roller 89, such as a rubber roller, can be used to roll R the compliant assembly 75 in a roll direction $R_D$.

The rolling R can begin at a first end (75a, 81a) and end at a second end (75b, 81b) of the compliant assembly 75 and the belt material 81. After the compliant assembly 75 and the belt material 81 are connected with each other (see FIG. 36), then the first and second ends (81a, 81b) can be joined to form a belt 100 as depicted in FIGS. 37a and 37b. As described above, a gap 70g may separate the first and second ends (75a, 75b). Splicing tape or the like may be used to cover the gap 70g. A piece of splicing tape 81t, or the like, can also be used to connect the first and second ends (81a, 81b) of the belt material 81 to form the belt 100. After the belt 100 is formed, the layers 71 (i.e. 33 and 36) can be peeled back P to expose the imprint stamp 20t on the compliant media 70. A suitable splicing tape includes but is not limited to a high temperature silicone based tape.

The belt material 81 can be an optically transparent material so that light L can pass though the belt material 81, the compliant media 70, and the imprint stamp 20t. A suitable optically transparent material for the belt material 81 includes but is not limited to a DuPont™ Mylar®. For example, a light source 99, such as a ultraviolet light source, can be positioned inside or outside of the belt 100 to irradiate and cure a photopolymer material (not shown) that is urged into contact with the imprint stamp 20t. The belt material 81 can have a thickness $t_B$ from about 50.0 µm to about 150.0 µm.

Although several embodiments of an apparatus and a method of the present invention have been disclosed and illustrated herein, the invention is not limited to the specific forms or arrangements of parts so described and illustrated. The invention is only limited by the claims.

What is claimed is:

1. An embossing apparatus, comprising:
    a flexible substrate including a coated side and a base side;
    a coating unit for depositing a photopolymer material having a first thickness on the coated side;
    an embossing belt comprising an optically transparent belt material and an optically transparent compliant media connected with the belt material, the compliant media including an optically transparent imprint stamp having an imprint pattern therein;
    a plurality of transport rollers connected with the belt material and operative to support the embossing belt;
    a drive unit for imparting a drive motion to the embossing belt and the flexible substrate;
    a backing drum wrapped by a portion of the base side and by a portion of the compliant media so that a tension is imparted in the embossing belt and the tension generates a pressure between the flexible substrate and the embossing belt,
    the drive motion is operative to transport the base side over the backing drum and to urge the imprint stamp and the coated side into contact with each other so that the imprint pattern is embossed in the photopolymer material and forms a replicate pattern in the photopolymer material; and
    an ultraviolet light source for irradiating the replicate pattern with an ultraviolet light, the ultraviolet light source is positioned so that the ultraviolet light first passes through the optically transparent belt material, then passes through the optically transparent compliant media, and finally passes through the optically transparent imprint stamp to irradiate the replicate pattern in the photopolymer material, and the ultraviolet light source is positioned so that the irradiating occurs contemporaneously with the embossing of the replicate pattern in the photopolymer material.

2. The embossing apparatus as set forth in claim 1, wherein the flexible substrate is opaque to the ultraviolet light.

3. The embossing apparatus as set forth in claim 1, wherein the ultraviolet light source has a position relative to the embossing belt selected from the group consisting of a position inside of the embossing belt and a position outside of the embossing belt.

4. The embossing apparatus as set forth in claim 1, wherein the ultraviolet light source comprises a UVA ultraviolet light source.

5. The embossing apparatus as set forth in claim 1, wherein the ultraviolet light includes a wavelength from about 300.0 nanometers to about 400.0 nanometers.

6. The embossing apparatus as set forth in claim 1, wherein the coating unit comprises a coater selected from the group consisting of a Gravure Coater, a micro gravure coater, and a Slot Die coater.

7. The embossing apparatus as set forth in claim 1, wherein the first thickness of the photopolymer material is in a range from about 0.05 micrometers to about 2.0 micrometers.

8. The embossing apparatus as set forth in claim 1, wherein at least one of the transport rollers is connected with the drive unit and the drive unit is operative to rotate the transport roller to impart the drive motion to the embossing belt and the flexible substrate.

9. The embossing apparatus as set forth in claim 1 and further comprising:
    a supply reel for carrying the flexible substrate and for dispensing the flexible substrate to the coating unit.

10. The embossing apparatus as set forth in claim 1 and further comprising:
    a takeup reel for collecting the flexible substrate after the flexible substrate has been embossed and cured.

11. The embossing apparatus as set forth in claim 10, wherein the takeup reel is connected with the drive unit and the drive unit is operative to rotate the takeup reel to collect the flexible substrate and to impart the drive motion.

12. The embossing apparatus as set forth in claim 1, wherein the compliant media comprises an optically transparent silicone-based elastomer material that is laminated to an optically transparent transfer adhesive layer.

13. The embossing apparatus as set forth in claim 12, wherein the optically transparent silicone-based elastomer material is a material selected from the group consisting of polydimethyl siloxane and a silicone-based conformal coating.

14. The embossing apparatus as set forth in claim 12, wherein the optically transparent transfer adhesive layer is an optically clear silicone adhesive.

15. The embossing apparatus as set forth in claim 1, wherein the optically transparent belt material comprises a Polyester film.

16. The embossing apparatus as set forth in claim 1, wherein the ultraviolet light source further includes a reflector for focusing the ultraviolet light at a point where the imprint stamp is urged into contact with the coated side so that the photopolymer material is not cured before the imprint pattern is embossed in the photopolymer material.

* * * * *